(12) United States Patent
Zhang et al.

(10) Patent No.: US 11,291,133 B2
(45) Date of Patent: Mar. 29, 2022

(54) SELECTIVE GROUND FLOOD AROUND REDUCED LAND PAD ON PACKAGE BASE LAYER TO ENABLE HIGH SPEED LAND GRID ARRAY (LGA) SOCKET

(71) Applicant: Intel Corporation, Santa Clara, CA (US)

(72) Inventors: Zhichao Zhang, Chandler, AZ (US); Gregorio R. Murtagian, Phoenix, AZ (US); Kuang C Liu, Queen Creek, AZ (US); Kemal Aygun, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 852 days.

(21) Appl. No.: 15/938,980

(22) Filed: Mar. 28, 2018

(65) Prior Publication Data

US 2019/0307009 A1 Oct. 3, 2019

(51) Int. Cl.
*H05K 7/10* (2006.01)
*H05K 1/11* (2006.01)
*H05K 1/02* (2006.01)
*H01R 13/24* (2006.01)

(52) U.S. Cl.
CPC ........... *H05K 7/1061* (2013.01); *H01R 13/24* (2013.01); *H05K 1/0253* (2013.01); *H05K 1/112* (2013.01); *H05K 2201/093* (2013.01); *H05K 2201/09609* (2013.01); *H05K 2201/10719* (2013.01)

(58) Field of Classification Search
CPC .... H05K 7/1061; H05K 1/0253; H05K 1/112; H05K 2201/093; H05K 2201/09609; H05K 2201/10719; H01R 13/24

USPC ........................................................ 439/330
See application file for complete search history.

(56) References Cited

U.S. PATENT DOCUMENTS

| | | | | |
|---|---|---|---|---|
| 7,695,288 B2* | 4/2010 | Ma | .......................... | H01R 43/20 |
| | | | | 439/70 |
| 8,148,646 B2* | 4/2012 | Fan | .......................... | G01R 3/00 |
| | | | | 174/261 |
| 8,851,904 B2* | 10/2014 | Chang | ....................... | H05K 7/10 |
| | | | | 439/71 |
| 9,033,737 B2* | 5/2015 | Chang | ................. | H01R 13/6588 |
| | | | | 439/607.05 |
| 9,059,519 B2* | 6/2015 | Lin | .......................... | H01Q 9/045 |
| 9,106,022 B2* | 8/2015 | Cai | ..................... | H01R 13/6471 |
| 9,240,657 B2* | 1/2016 | Chang | ................ | H01R 13/2442 |
| 9,252,077 B2* | 2/2016 | Molzer | ................... | H01L 23/66 |

(Continued)

*Primary Examiner* — Peter G Leigh
(74) *Attorney, Agent, or Firm* — Schwabe, Williamson & Wyatt P.C.

(57) ABSTRACT

Embodiments include a transmission line-land grid array (TL-LGA) socket assembly, a TL-LGA socket, and a package substrate. The TL-LGA socket assembly includes a TL-LGA socket having an interconnect in a housing body, the interconnect includes a vertical portion and a horizontal portion. The housing body has a top surface and a bottom surface, where the top surface is a conductive layer. The TL-LGA socket assembly also includes a package substrate having a base layer having a signal pad and a ground strip. The base layer is above the conductive layer of the housing body of the TL-LGA socket. The ground strip is above the horizontal portion of the interconnect and adjacent to the signal pad. The horizontal portion is coupled to the signal pad on the base layer. The package substrate may have a pad with a reduced pad area.

25 Claims, 12 Drawing Sheets

(56) References Cited

U.S. PATENT DOCUMENTS

| | | | | |
|---|---|---|---|---|
| 9,474,147 | B2 * | 10/2016 | Masuda | H05K 7/1069 |
| 10,135,162 | B1 * | 11/2018 | Hejase | H01R 12/526 |
| 2001/0012739 | A1 * | 8/2001 | Grube | H01L 24/06 |
| | | | | 439/862 |
| 2011/0070750 | A1 * | 3/2011 | Reisinger | H01R 13/2442 |
| | | | | 439/66 |
| 2013/0183861 | A1 * | 7/2013 | Chang | H01R 12/51 |
| | | | | 439/607.35 |
| 2015/0170996 | A1 * | 6/2015 | Altabella Lazzi | ................. |
| | | | | H01L 23/49838 |
| | | | | 257/774 |
| 2018/0047589 | A1 * | 2/2018 | Rogren | H01L 24/97 |
| 2018/0375243 | A1 * | 12/2018 | Hsu | H01R 12/712 |

\* cited by examiner

US 11,291,133 B2

SELECTIVE GROUND FLOOD AROUND REDUCED LAND PAD ON PACKAGE BASE LAYER TO ENABLE HIGH SPEED LAND GRID ARRAY (LGA) SOCKET

FIELD

Embodiments relate to packaging semiconductor devices. More particularly, the embodiments relate to an electrical connector, such as a high-speed land grid array (LGA) socket with a selective ground flood strip adjacent to a reduced land pad on a base layer.

BACKGROUND

Various types of conventional electrical connectors are known for electrically connecting an integrated circuit (IC) package, such as a central process unit (CPU), with a printed circuit board (PCB). One of the electrical connectors typically used is an land grid array (LGA) socket, which is particularly utilized for electrically connecting IC packages/devices with circuit boards. The LGA socket is a type of surface-mount packaging socket connector for ICs that use pins on the socket to connect, for example, the CPU to the PCB. Typically, an LGA socket has a grid of spring-like contacts, each with a landing pad for engagement with a respective metallic pad on the underside of a packaged electronic device.

These LGA sockets generally have lands or pads which are placed on 1.0-mm centerline spacing and below. These LGA sockets are profiled with arrays of 50 by 50 and even greater. Given the plurality of lands and contacts, their centerline spacing, and given the design rules for the vertical and horizontal portions of each contact, the LGA sockets cause a variety of problems in practice in connection with the electrical performance, costs, life span, and scaliability of these LGA sockets.

One of these problems is a heightened insertion loss as the LGA socket is used to connect high volume CPU sockets. The LGA socket also poses extremely challenging channel electrical budgets at higher frequencies. In addition, these LGA sockets are typically limited with data rate demands and scalability. Another problem is the size of the LGA land pad areas which are typically larger than what is required. Furthermore, other alternative electrical connectors currently used are pogo-pin test sockets. The pogo-pin test sockets facilitate with some of the increasing electrical demands needed in the existing socket technologies, however the pogo-pin test sockets emanate an exceedingly high cost compared to the LGA sockets.

As successive generations of integrated circuit fabrication continue to scale in size and speed, the electrical sockets used to connect IC packages will have to accommodate stricter electrical performances such as lower impedance mismatch, reduced return loss and insertion loss over a broader frequency, higher speed data rates, and/or the like.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Embodiments described herein variously include techniques or devices for enabling a high-speed land grid array (LGA) socket, such as a transmission line (TL)-LGA (hereinafter, referred to as "TL-LGA") socket, having interconnects that are positioned below selectively grounded strips that are adjacent to reduced LGA land pads on a base layer of a package. Specifically, embodiments described herein also include the TL-LGA socket having cascaded transmission line (or interconnect) structures for facilitating maximum bandwidth and data rate speeds. Various embodiments exploit mechanisms for providing TL-LGA socket connector structures that can be coupled to LGA land pads with reduced pad sizes that are positioned adjacent to selective ground strips on the package, where these TL-LGA socket connector structures facilitate high-speed signaling pins of the TL-LGA socket.

Figure 4:
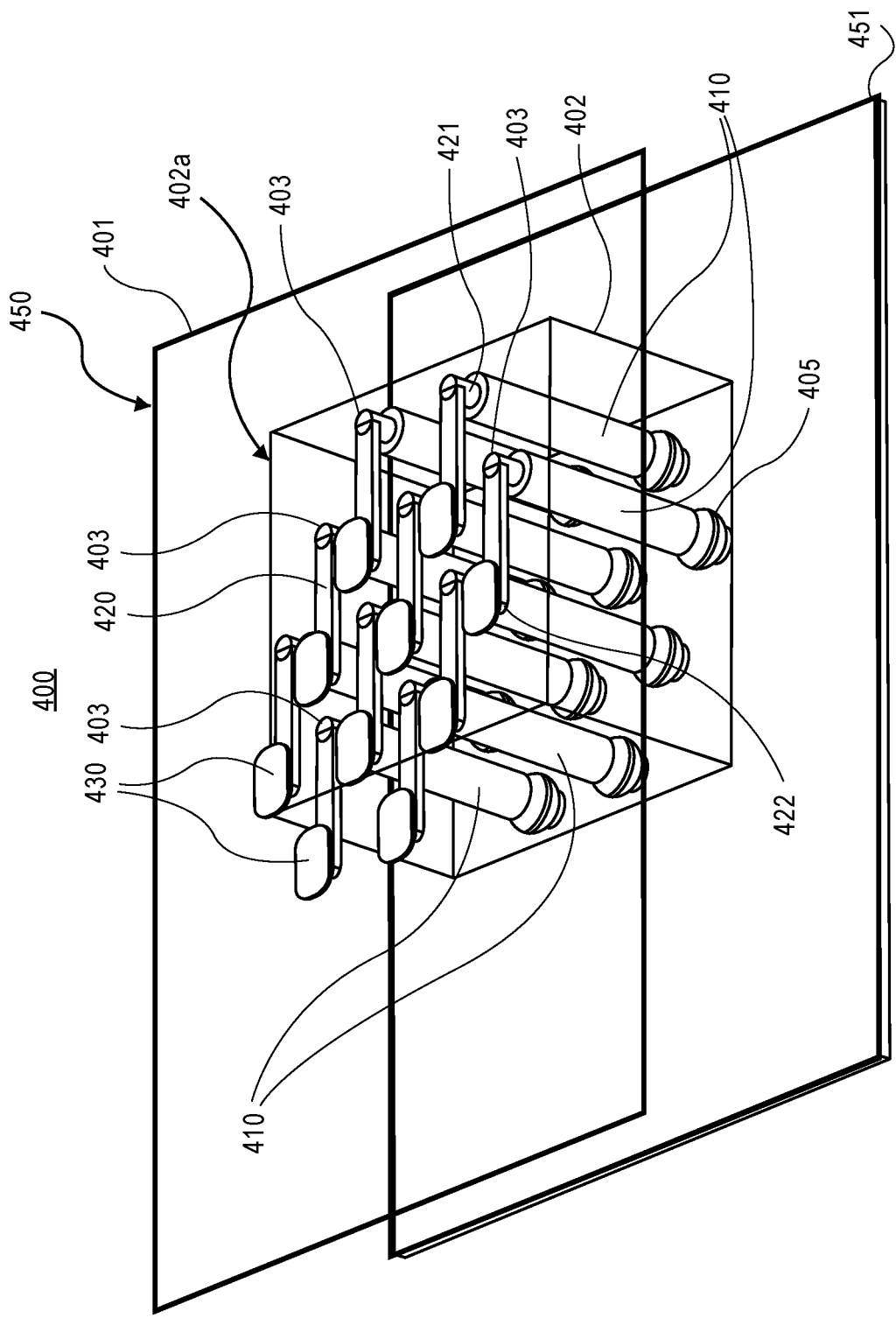
FIG. 4 is a top, perspective view of a plurality of interconnects of a TL-LGA socket, according to one embodiment.

These embodiments help to improve the LGA technologies and designs by approximating each critical portion of the socket pin (also referred to as a TL-LGA interconnect) with transmission line structures and design rules (e.g., the TL-LGA interconnects are arranged in a cascading pattern as shown in FIG. 4). Accordingly, the embodiments described herein pattern the TL-LGA interconnects in a cascaded configuration/design within the TL-LGA socket to enable (i) a reduced impedance mismatch, and (ii) a lowered/optimized return loss and insertion loss performance over a broad frequency spectrum to support high-speed data rate demands.

Figure 1:
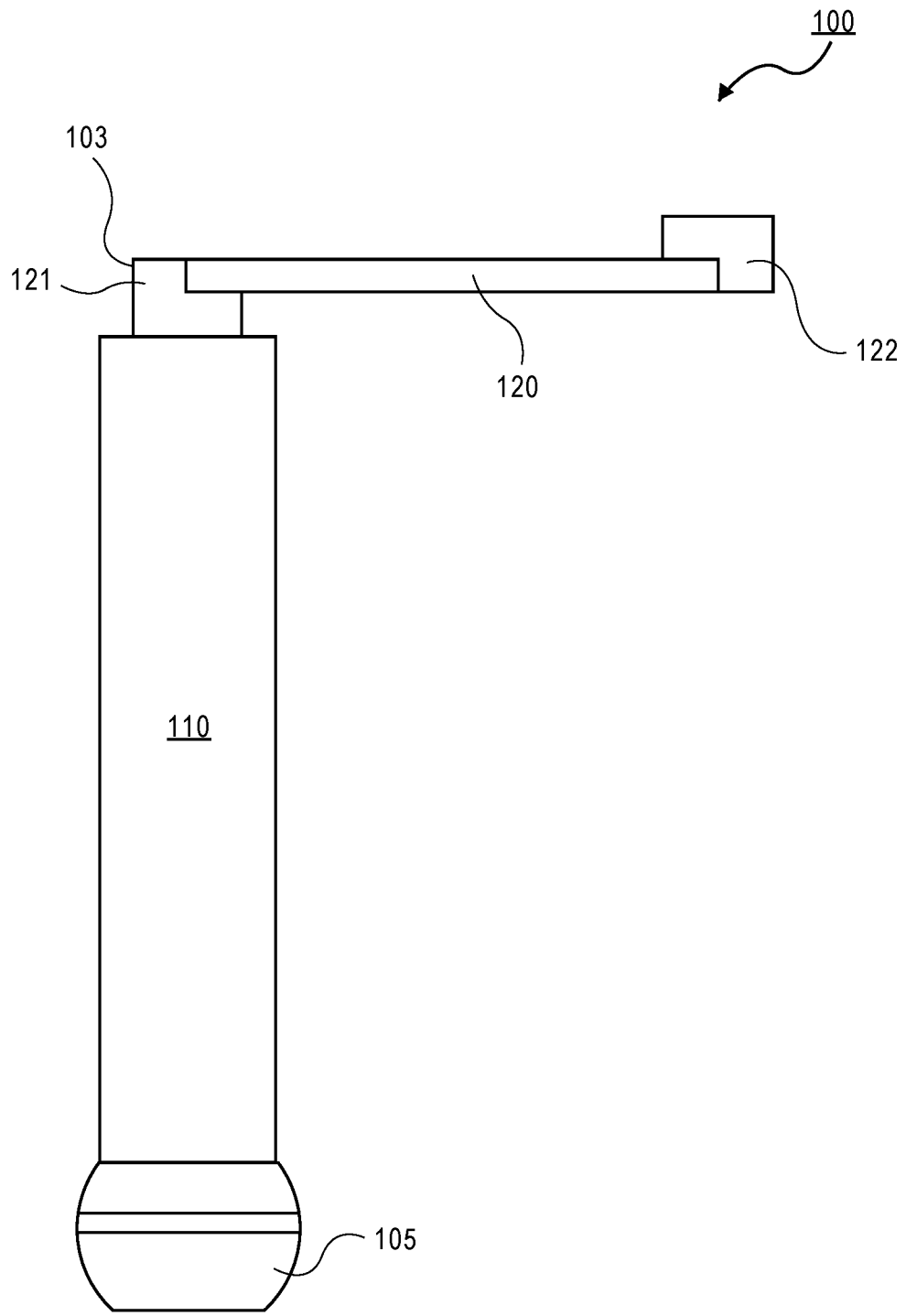
FIG. 1 is a cross-section view of a transmission line of a land grid array (LGA) (TL-LGA) socket having a vertical portion, a horizontal portion, and a solder ball, according to one embodiment.
Figure 2B:
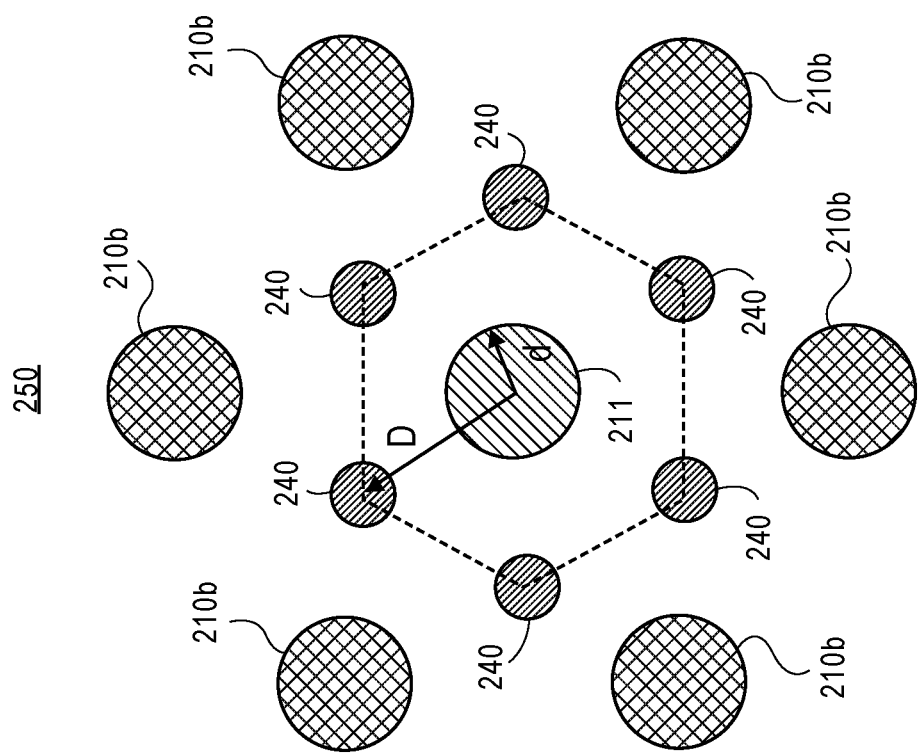
FIG. 2B is a top, perspective view of a coaxial cable having a plurality of inter-stitched plated-through holes (PTHs) and a plurality of TL-LGA vertical portions with signal pins, according to embodiment.
Figure 2A:
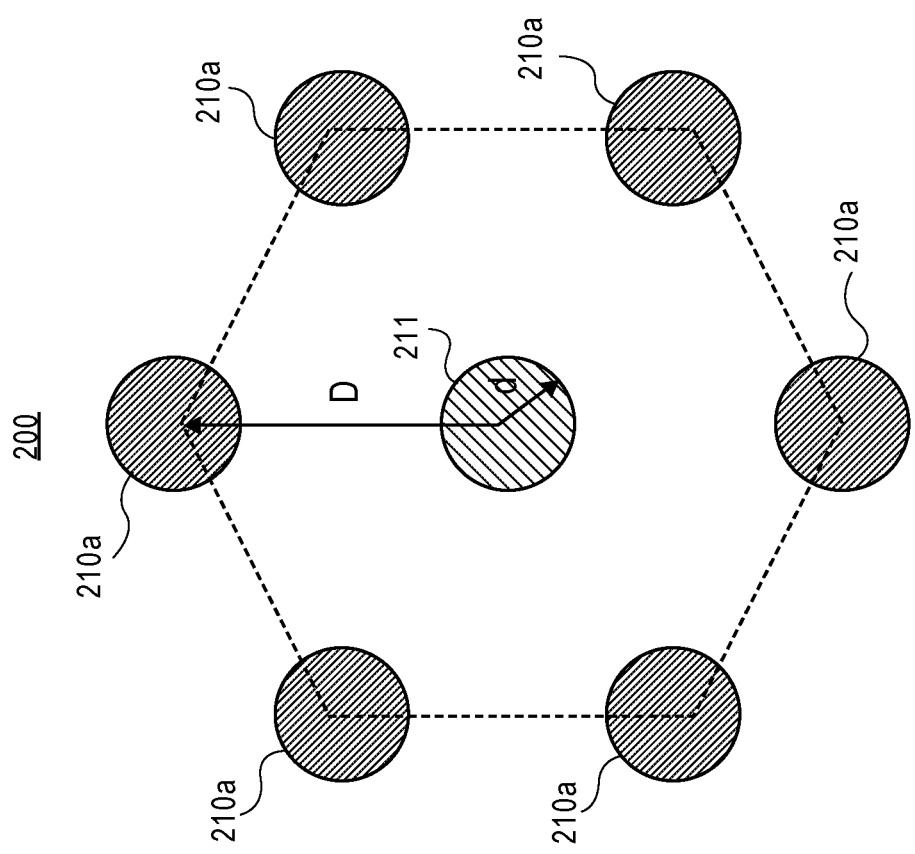
FIG. 2A is a top, perspective view of a coaxial cable having a plurality of TL-LGA vertical portions with a signal pin and ground pins, according to embodiment.

As used herein, a "transmission line" (also referred to as an interconnect, a transmission line LGA, a TL-LGA interconnect, a TL-LGA socket interconnect, a LGA contact/pin, etc.) refers to an interconnect (or a socket pin/contact) of a TL-LGA socket that includes a vertical portion and a cantilever (a horizontal portion) that is coupled to a pad of a package (e.g., as shown in FIG. 1). Additionally, one or more "transmission lines" may be formed (or redesigned) to have a coaxial cable transmission line design/structure (e.g., as shown in FIGS. 2A-2B) in a housing body of the TL-LGA socket (i.e., the vertical portions of the "transmission lines" form the coaxial cable). As used herein, a "coaxial cable" design refers to a shape/pattern that includes an inner (or center) conductor (e.g., a signal socket pin/pad) surrounded by an outer conductor, which may include one or more grounded contacts (or pads/vertical portions) and/or one or more grounded inter-stitched plated-through holes (PTHs). Note that a grounded component (e.g., a grounded pad) may be a pad that is coupled to a ground reference (or a ground plate, a grounded reference point, etc.).

Figure 5B:
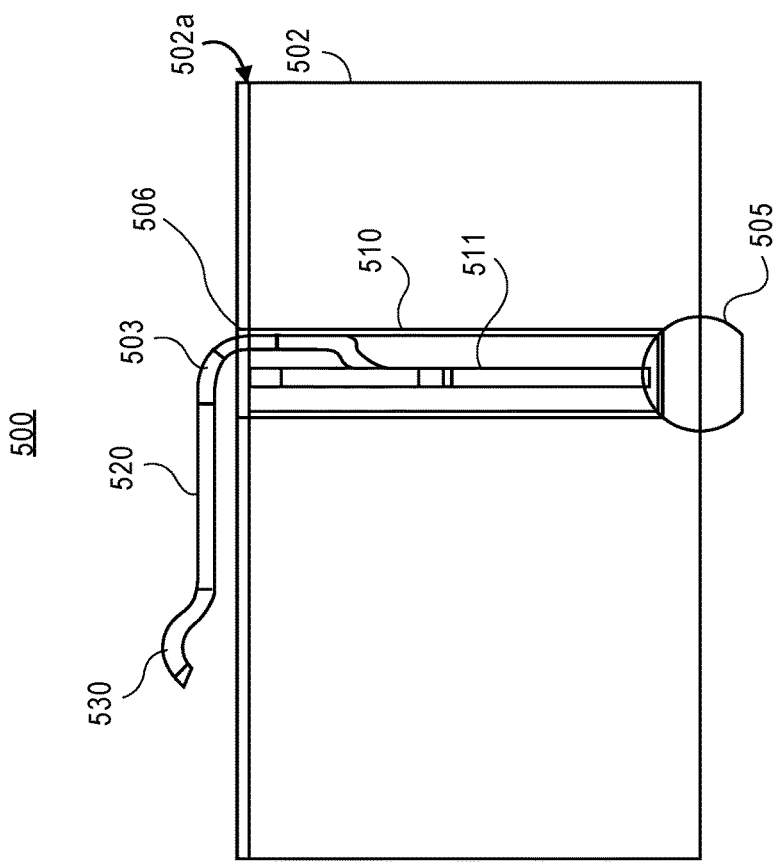
FIG. 5B is a cross-sectional view of an interconnect of a TL-LGA socket having a vertical portion and a horizontal portion, according to one embodiment.
Figure 5A:
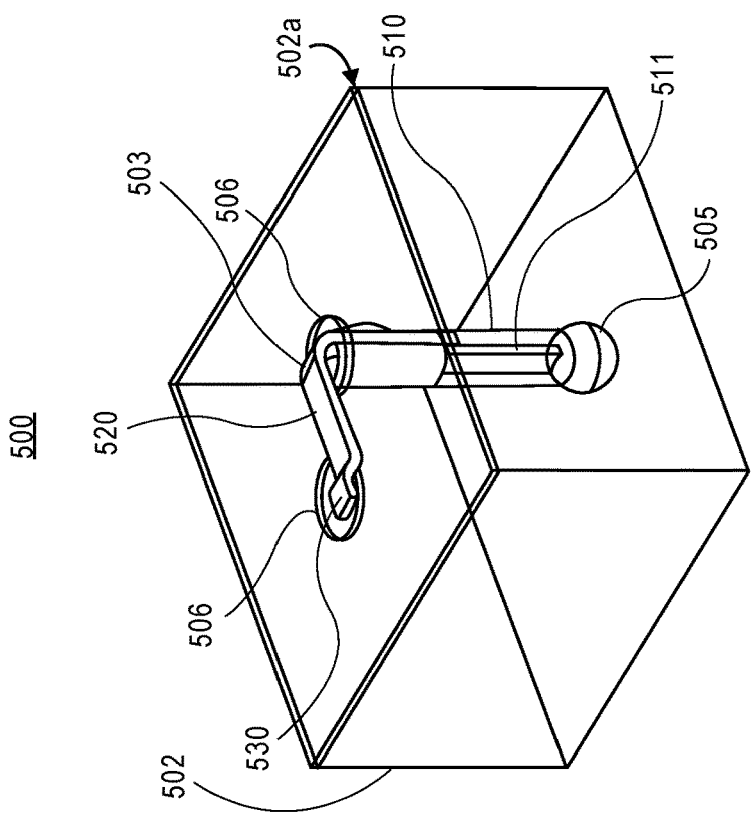
FIG. 5A is a top, perspective view of an interconnect of a TL-LGA socket having a vertical portion and a horizontal portion, according to one embodiment.
Figure 7A:
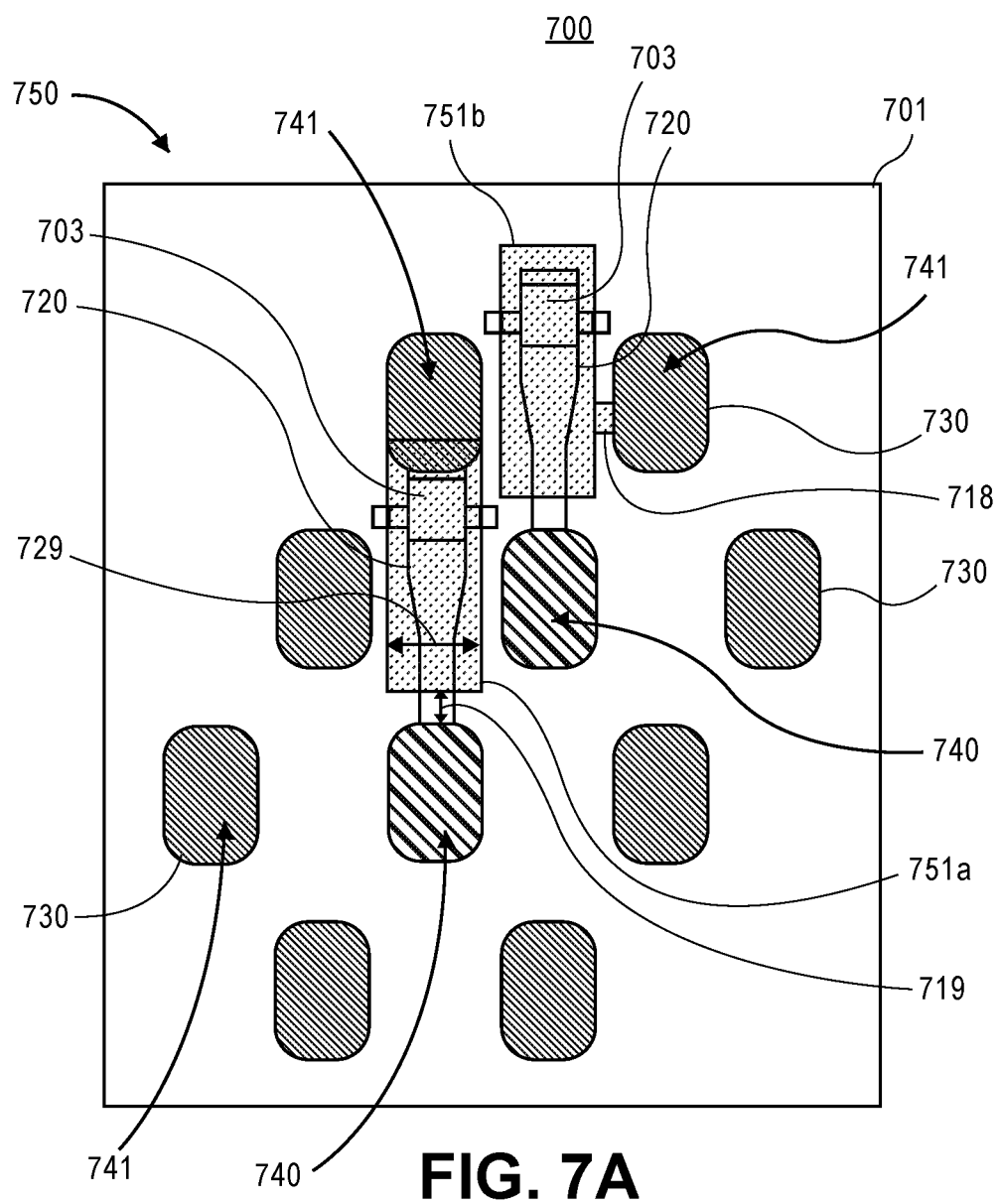
FIG. 7A is a plan view of a package with a base layer that includes a plurality of ground strips and a plurality of pads, and a TL-LGA socket including a plurality of TL-LGA interconnects with horizontal portions, according to embodiment.
Figure 7B:
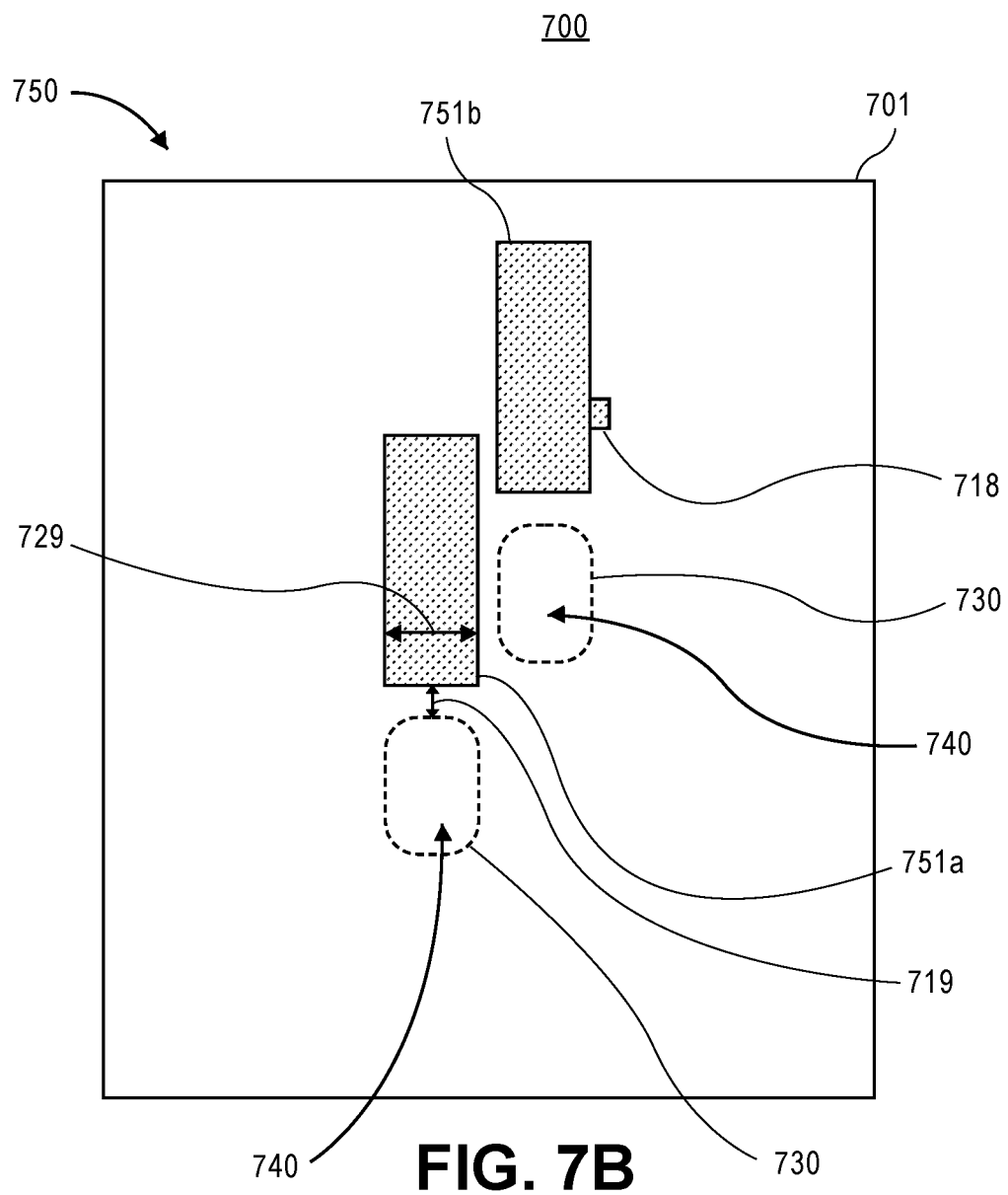
FIG. 7B is a plan view of a package with a base layer that includes a plurality of ground strips and a plurality of pads, according to embodiment.
Figure 8:
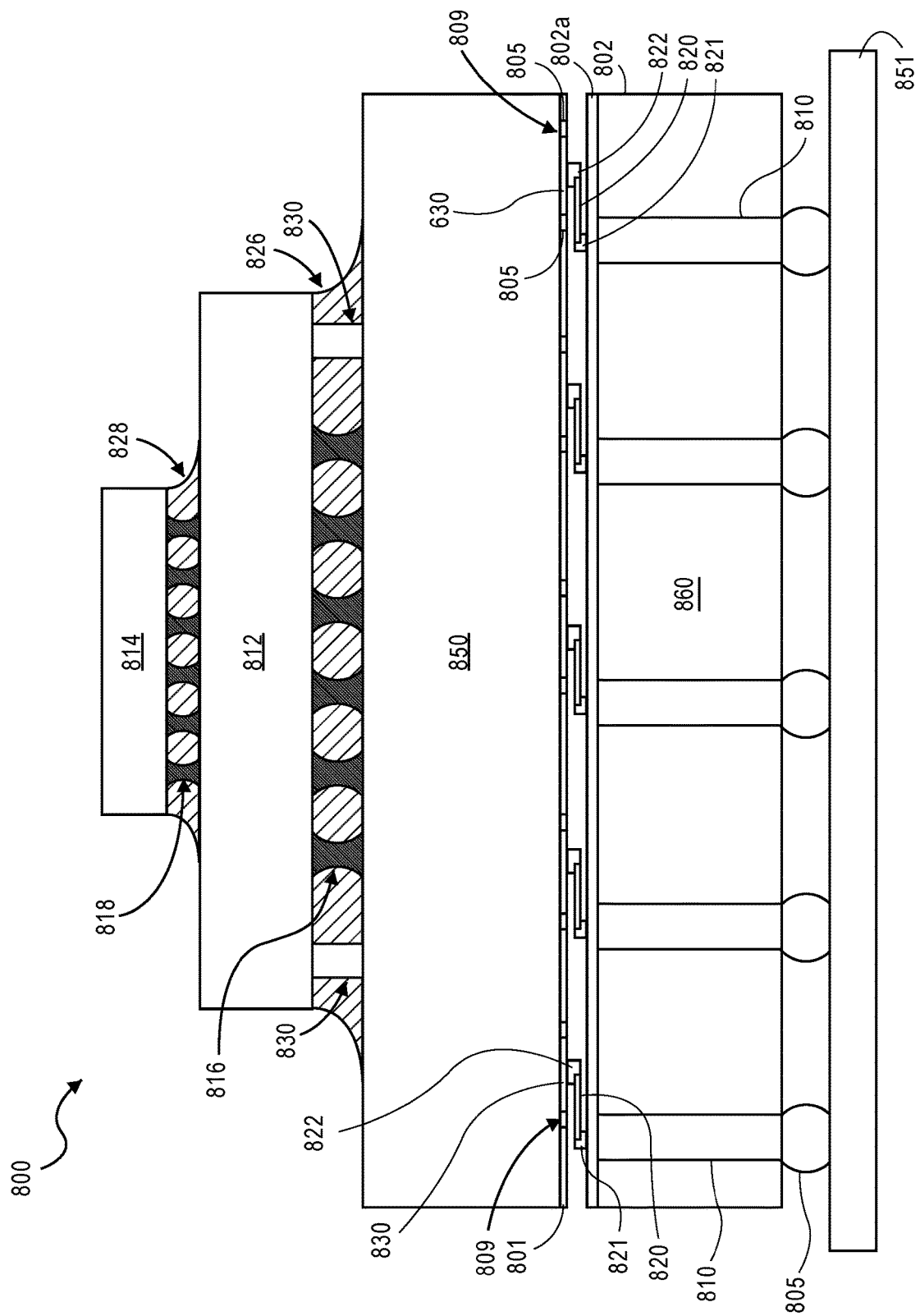
FIG. 8 is a cross-sectional view of an assembly having an integrated circuit die, a package substrate with a base layer, a TL-LGA socket, and a substrate, according to one embodiment.

According to some embodiments, a TL-LGA socket and a TL-LGA socket assembly are described. For one embodiment, the TL-LGA socket assembly (e.g., as shown in FIG. 8) includes a TL-LGA socket having an interconnect disposed in a housing body (e.g., as shown in FIGS. 4 and 5A-5B). The interconnect may have a vertical portion and a horizontal portion (also referred to as a cantilever) (e.g., as shown in FIGS. 1, 3A-3B, 4, 5A-5B, and 6A-7A). The housing body may include a top surface and a bottom surface that is opposite from the top surface (e.g., as shown in FIGS. 4 and 5A-5B), where the top surface may be a conductive layer. For another embodiment, the TL-LGA socket assembly further includes a package having a base layer, where the base layer includes a signal pad and a ground strip (e.g., as shown in FIGS. 6A-6B-7A-7B). The base layer of the package may be disposed above the conductive layer of the housing body of the TL-LGA socket (e.g., as shown in FIGS. 3A-3B and 6A-7A). For one embodiment, the horizontal portion of the interconnect of the TL-LGA socket is coupled to the signal pad on the base layer of the package (e.g., as shown in FIGS. 3A-3B and 6A-7A). For one embodiment, the ground strip may be disposed above the horizontal portion of the interconnect of the TL-LGA socket and may be adjacent to the signal pad on the base layer, according to one embodiment (e.g., as shown in FIG. 7A). For one embodiment, the horizontal portion of the interconnect of the TL-LGA socket is coupled to the signal pad on the base layer (e.g., as shown in FIGS. 3A-3B, 6A, 7A, and 8).

As used herein, a "TL-LGA socket assembly" refers to a packaging assembly that includes at least a TL-LGA socket and/or a package as described herein, where the package may be coupled to the TL-LGA socket. According to some embodiments, a TL-LGA socket is described. For one embodiment, the TL-LGA socket has a plurality of interconnects, where an interconnect includes a vertical portion and a horizontal portion (also referred to as a cantilever) (e.g., as shown in FIGS. 1 and 5A-5B). For one embodiment, the TL-LGA socket also includes a housing body that has a top surface and a bottom surface that is opposite from the top surface (e.g., as shown in FIGS. 4 and 5A-5B). The housing body may have the vertical portions of the plurality of interconnects disposed in the housing body, where the plurality of interconnects are disposed in the housing body to form a plurality of cascaded transmission lines (e.g., as shown in FIG. 4). For example, the vertical portions of the TL-LGA interconnects are disposed in the housing body, and the TL-LGA interconnects may be arranged (or positioned) in a cascaded configuration—i.e., a first TL-LGA interconnect is disposed on a first position of a first row, a second TL-LGA interconnect is disposed on a second position of a second row, and so on-to form a plurality of cascaded transmission lines in the house body.

As used herein, a "cascaded configuration" may refer to a zig-zag line of components in a vertical direction. For example, cascaded interconnects (or cascaded transmission lines) may refer to TL-LGA interconnects arranged/positioned in the TL-LGA socket in a zig-zag line in a vertical direction (e.g., as shown in FIG. 4). Furthermore, the embodiments of the TL-LGA socket dispose a plurality of transmission lines in a housing body to form cascaded transmission lines (or a cascaded interconnect structures) that improves the bandwidth and data rate speeds of the TL-LGA socket. As used herein, "cascaded transmission lines" refer to two or more TL-LGA transmission lines (or interconnects) arranged in a cascaded configuration (or a cascading pattern) (e.g., as shown in FIG. 4), where a sequence (or stream) of transmission lines are positioned and follow as falling like a cascade (i.e., a first TL-LGA transmission line is disposed on a first position of a first row, a second TL-LGA transmission line is disposed on a second position of a second row, and so on, to form a plurality of cascaded transmission lines). As such, the cascaded transmission lines are formed in the TL-LGA socket by positioning the interconnects in zig-zag lines in the vertical direction.

Figure 3A:
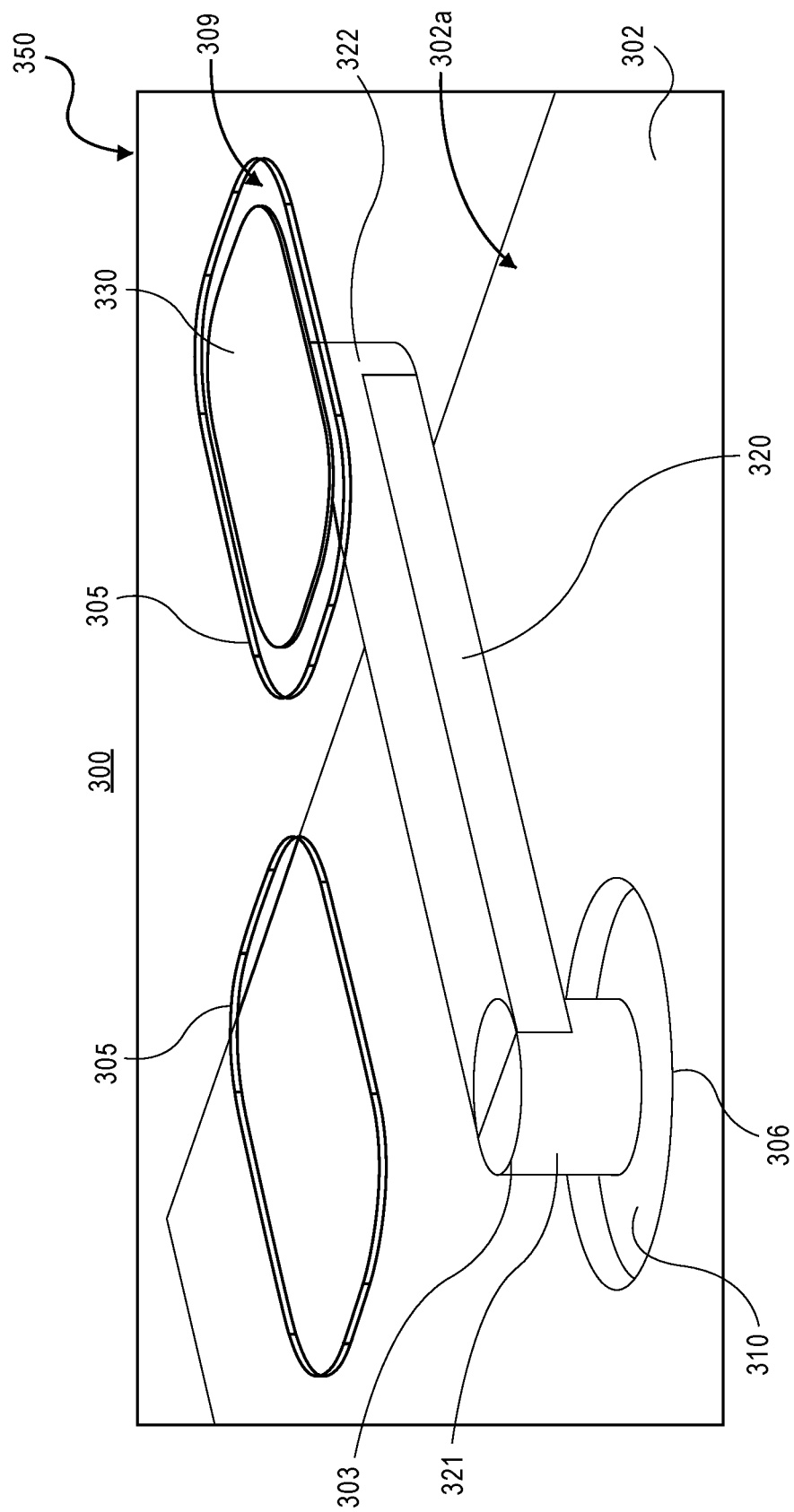
FIG. 3A is a top, perspective view of a TL-LGA socket including an interconnect with a horizontal portion coupled to a pad of a base layer of a package, according to one embodiment.
Figure 3B:
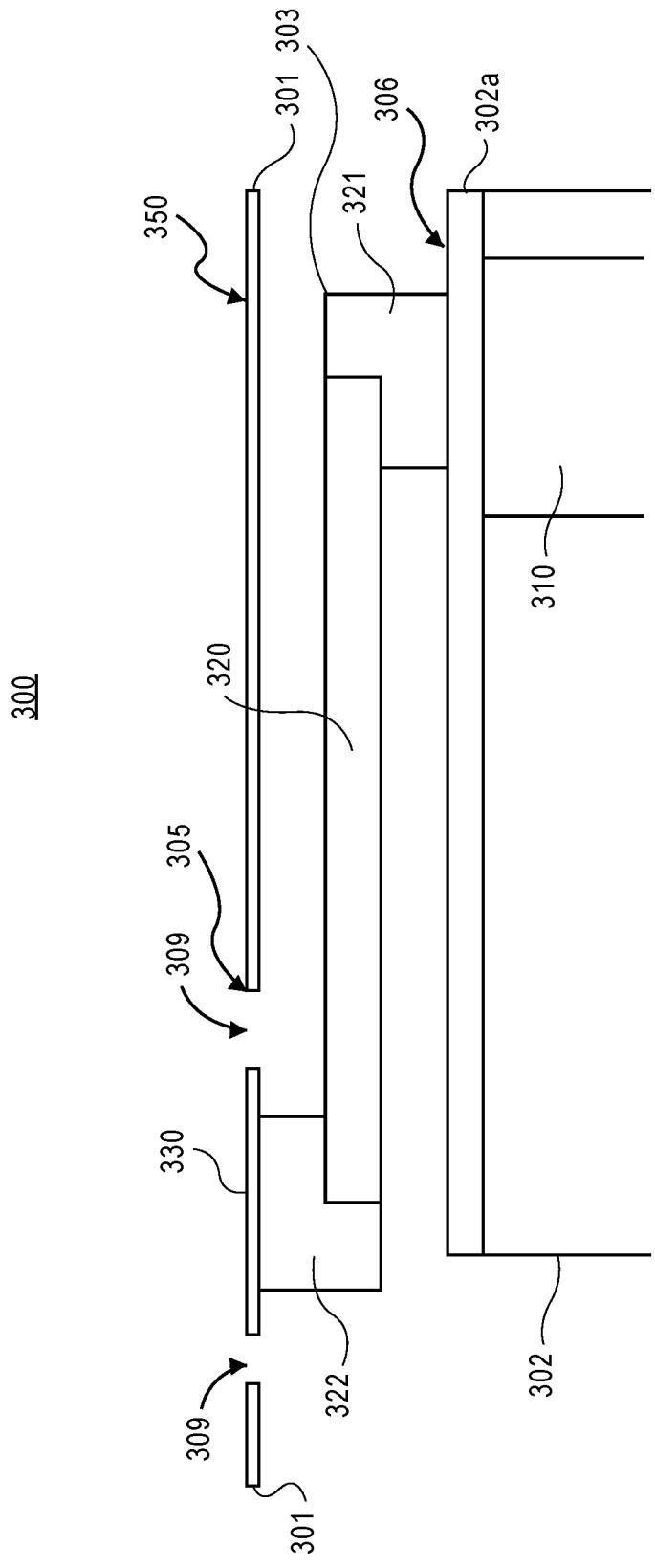
FIG. 3B is a cross-sectional view of a TL-LGA socket including an interconnect with a horizontal portion coupled to a pad of a base layer of a package, according to one embodiment.

For additional embodiments, the TL-LGA socket further includes a package having a base layer as the base layer includes a plurality pads and a plurality of pad openings (e.g., as shown in FIGS. 3A-3B). The base layer may be disposed above the top surface of the housing body (e.g., as shown in FIGS. 3A-3B). The horizontal portions of the plurality of interconnects may be coupled to the plurality of pads of the base layer (e.g., as shown in FIGS. 1 and 3A-3B). For example, the interconnects of the TL-LGA socket are coupled to the pads of the package as such the TL-LGA socket may be used to couple the TL-LGA socket to an integrated circuit (e.g., a microprocessor, a central processing unit (CPU), a die, etc.).

Additional embodiments of the TL-LGA socket may include the horizontal portions of the plurality of interconnects disposed between the base layer of the package and the top surface (or the top conductive layer) of the housing body (e.g., the horizontal portion, the base layer, and the top surface of the housing body are parallel to each other as shown in FIG. 3B). For some embodiments, the TL-LGA socket may include a plurality of solder balls disposed on the bottom surface of the housing body (e.g., as shown in FIGS. 1, 4, and 5A-5B). The plurality of solder balls may be used to couple the TL-LGA socket to a substrate (e.g., a printed circuit board (PCB)). For one embodiment, a ground reference may be used to couple to only the base layer of the package. In this embodiment, when only the base layer is coupled to a ground reference, the horizontal portion of the TL-LGA socket is parallel to the ground reference of the base layer, and thus the horizontal portion is implemented as a microstrip (i.e., the horizontal portion is (or acts/behaves/performs as) a type of microstrip). For an alternative embodiment, one or more ground references may be used to couple to both the base layer of the package and the top surface of the housing body. In this alternative embodiment, when both the base layer and the top surface of the housing body are coupled to the ground references, the horizontal portion of the TL-LGA socket is parallel to both the ground references of the base layer the top surface of the housing, and thus the horizontal portion is implemented as a stripline (i.e., the horizontal portion is (or acts/behaves/performs as) a type of stripline).

Additionally, for some embodiments, the package has the base layer that includes pad openings and pads (e.g., as shown in FIG. 3A). For example, a TL-LGA interconnect may have the vertical portion extend in the housing body from or near the top surface to the bottom surface (i.e., the vertical portion extends in the housing body in a z-direction), where the top end of the vertical portion may couple to the horizontal portion, and the bottom end of the vertical portion may couple to a solder ball (e.g., as shown in FIGS. 1 and 5B). For these embodiments, the interconnect of the TL-LGA socket may have one end of the horizontal portion coupled to the top end of the vertical portion (thus forming a transmission line in the TL-LGA socket), and may have the other/opposite end of the horizontal portion coupled to the pad of the package, which may be positioned and exposed in a pad opening of the base layer.

Embodiments of the TL-LGA socket improve semiconductor packaging solutions by enabling an LGA socket to meet the stricter requirements, such as the data rate demand and scalability, for through-socket high-speed inputs/outputs (IOs) (HSIOs) needed in the next-generation server and client products. Furthermore, the embodiments of the TL-LGA socket help to extend the life span of the LGA and multi-generation potential products as a low cost socket solution. For example, these embodiments provide a TL-LGA socket to satisfy the next-generation through-socket HSIOs (e.g., peripheral component interconnect express (PCIe) G5) that can operate roughly at 32 Gb/s or higher and that pose challenging channel electrical budgets (e.g., this drives a large electrical budget reduction at a higher frequency for every component in the channel, including the socket).

Embodiments of the TL-LGA socket enhance electrical socket connector structures by (i) improving the electrical performance and characteristics such as improved bandwidth and data rate speeds, reduced return and insertion losses, and decreased impedance mismatch; (ii) significantly reduced assembly cost; (iii) increased potential for product generation scaling and cost reduction; (iv) curbing the need for height reduction and design challenges; and (v) redefining the LGA socket design flow and methodology by implementing cascaded transmission line structures to allow maximal electrical bandwidth and thus focusing on the electrical performance rather than the mechanical design as the starting point of the LGA socket design flow and methodology. Note that, for example, by redefining the LGA socket flow and methodology, the embodiments of the TL-LGA socket may facilitate/enhance the PCIe capabilities (e.g., the PCIe G5 capabilities) by enabling higher data rate speeds and thus providing more diversified and superior applications for consumer next-generation products.

Accordingly, the embodiments described herein improve the LGA socket/connector which is usually associated as a lumped electrical component with parasitic characteristics, such as inductance and capacitance. For example, the inductance and capacitance particularly determine the impedance of the LGA socket and therefore the return loss and insertion loss at a high frequency range establishes the electrical performance for the respective LGA socket. Here, the embodiments of the TL-LGA socket achieves good electrical performance over a broad bandwidth by (i) reducing the parasitic inductance and capacitance to avoid resonance, and (ii) maintaining the ratio of parasitic inductance and capacitance for a relatively constant impedance profile over a broadband of frequency. This is achieved by implementing a transmission line in the embodiments of the TL-LGA socket, as the transmission line facilitates the features and design rules of each segment of the TL-LGA socket with a cascaded transmission line process (i.e., this ensures the electrical performance of the TL-LGA socket is optimized by using the one or more cascaded transmission line segments).

Certain features of various embodiments are described herein with reference to the use of a TL-LGA socket (or connector) to couple an IC device and a package substrate. However, such description may be extended to additionally or alternatively apply to any of a variety of other applications where, for example, TL-LGA socket is to couple to any IC device and/or circuit board. The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices including a TL-LGA socket to couple an IC device (e.g., an IC chip/die) and/or the package substrate to a substrate (e.g., a motherboard, a PCB, etc.) or other such motherboard device/board/card.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

FIG. 1 is a cross-section view of a transmission line 100 having a vertical portion 110 and a horizontal portion 120, according to one embodiment. For one embodiment, the transmission line 100 may be a single TL-LGA socket interconnect 103 (or a TL-LGA socket pin) of a plurality of interconnects (e.g., as shown in FIG. 4), where the plurality of interconnects may be disposed in/on the TL-LGA socket.

According to some embodiments, the transmission line 100 includes two main components: the vertical portion 110 and the horizontal portion 120 (or a planar cantilever). For one embodiment, the vertical portion 110 may be disposed in a housing body/cavity (e.g., as shown in FIGS. 5A-5B) of the TL-LGA socket. For one embodiment, the vertical portion 110 may have a cylindrical outer surface surrounding a pin (or a socket pin), where the vertical portion 110 may have a hollow body within the cylindrical outer surface (e.g., as shown in FIGS. 5A-5B). For one embodiment, the horizontal portion 120 may have a planar rectangular shape. For one embodiment, the horizontal portion 120 may be a planar cantilever 120 having a first connector 121 and a second connector 122 on opposite ends of the planar cantilever 120, where the horizontal portion 120 is coupled (and perpendicular) to the vertical portion 100 and may be partially or fully exposed in the air (e.g., as shown in FIG. 3B). According to some embodiments, the vertical portion 110 and the horizontal portion 120 may be designed with different transmission line features and characteristics based on their structure and surrounding feature(s).

The vertical portion 110 may be disposed (or formed) as a coaxial cable transmission line. The vertical portion 110 may have a cylindrical shape/member (i.e., a coaxial cable shape) which may reduce the need for a socket z-height reduction. Note that the vertical portion 110 is not limited to a cylindrical shape and may have any other shape based on the desired TL-LGA packaging design, which include other shapes such as polygonal, sphere, hexagon, circular, and/or square. For some embodiments, the vertical portion 110 may be implemented as an inner conductor and an outer conductor (described in further detail below in FIGS. 2A-2B). The vertical portion 110 may include a cylindrical outer surface that houses a socket pin (e.g., as shown in FIG. 5B), where the cylindrical outer surface may be formed of a liquid-crystal polymer (LCP) material.

The horizontal portion 120 may be implements, but not limited to, as a stripline and/or a microstrip. For some embodiments, the horizontal portion 120 of the TL-LGA socket is the horizontal portion of the transmission line 100, which may be illustrated as having a planar component/structure in the form of a microstrip (with a ground reference only on a base layer of the package) or the stripline (with the ground reference(s) on both a base layer of a package, and a conductive layer (or metal plating) of a top surface of a housing body of the TL-LGA socket). For one embodiment, the package may be, but not limited to, any semiconductor package, packaging enclosure, package substrate, and the like. Furthermore, these planar components allow the mechanical design needs of the TL-LGA socket to meet the electrical requirements, resulting from a planar/horizontal cantilever that is parallel to ground reference(s) under a normal loading condition.

For example, the horizontal portion 120 may be a planar cantilever 120 that is coupled to the vertical portion 110 with the first connector 121, and coupled to a pad (or LGA pad) on the base layer of the package with the second connector 122. For one embodiment, the first connector 121 and the second connector 122 have circular shapes that extends vertically on opposite ends of the horizontal portion 120 (i.e., the first connector 121 extends vertically to couple the vertical portion 110 to the planar cantilever 120, and the second connector 122 extends vertically to couple the planar cantilever 120 to the pad on the base layer of the package). For one embodiment, the second connector 122 may have an exposed top surface that is parallel to the planar cantilever 120. For example, the exposed top surface of the second connector 122 of the horizontal portion 120 may be coupled to the pad on the conductive base layer of a package, where the pad is disposed in a corresponding pad opening on the conductive base layer of the package, and where the conductive base layer is above the conductive layer of the housing body (e.g., as shown in FIGS. 3A-3B).

Note that, as shown in FIG. 1, the connectors 121-122 are illustrated as separate components that are used to couple the vertical portion 110, the horizontal portion 120, and the pad (as shown in FIGS. 3A-3B), but the transmission line 100 may be formed without the connectors 121-122 based on the desired packaging design (e.g., as shown in FIGS. 5A-5B). Also note that the horizontal portion 120 may be referred to as the planar cantilever 120.

In one embodiment, the transmission line 100 may have the horizontal portion 120 formed with stamp-metal manufacturing processes (e.g., to attain an optimized differential impedance for the transmission line design, a TL-LGA socket may have a height of less than roughly 2.7 mm, and a horizontal portion may have a thickness of less than roughly 80 um, a width of less than roughly 250 um, and a distance between a ground conductive base layer of a package and a ground conductive layer on a housing body of less than roughly 100 um). Note that the medium in between the top and bottom ground conductive layers may be air.

For some embodiments, a plurality of TL-LGA interconnects may be formed by cascading vertical portions (e.g., vertical portion 110) and horizontal portions (e.g., horizontal portions 120)—which comprise (and/or are represented as) a plurality of transmission lines (e.g., transmission line 100) with one or more small vertical cylindrical transitions coupled with solder balls (e.g., solder ball 105). According to some embodiments, the vertical portion can be a hollow structure/member with a variety of cross-section shapes (e.g., various vertical cylindrical members/connections can be optimized to meet the mechanical needs). In addition, the vertical portion may behave one or more slots to facilitate the mechanical needs/requirements as long as outer contour/surface remains roughly unchanged. Likewise, the geometry of the cantilever (or the horizontal portion) can be further tuned as long as the impedance profile also remains roughly unchanged.

According to some embodiments, the package may have the conductive base layer that has the pad in a corresponding pad opening, leaving a small gap between the pad and the corresponding pad opening of the base layer (e.g., as shown in FIG. 3A). For some embodiments, the base layer may be grounded and provide the only grounding needed for the TL-LGA socket, where the horizontal portion 120 is to be implemented/disposed as a microstrip. However, for other embodiments, the base layer and the top surface of the housing body are parallel to each other (e.g., as shown in FIG. 3A), where both the base layer and the top surface of the housing body are grounded. In these other embodiments, the base layer is grounded, and the top surface of the housing body may also be grounded with a grounded metal plating on the top surface of the housing body, as such the horizontal portion 120 is to be implemented/disposed as a stripline. For example, the grounded top surface of the housing body may include a conductive layer that is formed with (i) metal plating connected to ground contacts, and (ii) metal plating insulated from any of the signal contacts. For some embodiments, the planar cantilever of the horizontal portion 120 has a planar structure which is parallel to and in between both the conductive layers of the housing body and the package. That is, for example unlike existing technologies of a LGA socket pin having a spring-like wavy, horizontal section, a majority of the horizontal portion 120 of the TL-LGA interconnect 100 is a flat/straight surface formed in one plane that may be parallel to the conductive layers of the housing body and the package.

Note that the transmission line 100 of the TL-LGA socket of FIG. 1 may include fewer or additional packaging components based on the desired packaging design.

FIG. 2A is a top, perspective view of a first coaxial cable 200 having a plurality of vertical portions with a signal pin 211 and ground pins 210a, according to embodiment. FIG. 2B is a top, perspective view of a second coaxial cable 250 having a plurality of inter-stitched ground plated-through holes (PTHs) 240 surrounding a TL-LGA vertical portion with a signal pin 211, and a plurality of TL-LGA vertical portions with signal pins 210b surrounding the inter-stitched ground PTHs 240 and the signal pin 211, according to embodiment.

As shown in FIG. 2A, the first coaxial cable 200 illustrates a plurality of TL-LGA vertical portions with ground pins 210a having a first coaxial cable design that uses adjacent ground pins 210 as ground references (shown with a pattern of closely-spaced diagonal stripes in a backslash direction) that surround the signal pin 211. As shown in FIG. 2B, the second coaxial cable 250 illustrates a plurality of TL-LGA vertical portions with signal pins 210b having a second coaxial cable design that uses ground PTHs 240 as ground references (shown with a pattern of closely-spaced diagonal stripes in a backslash direction) that surround the signal pin 211, where the adjacent signal pins 210b surround the ground PTHs 240 and the signal pin 211.

For some embodiments, the vertical portions 210a-b and 211 of a TL-LGA socket of FIGS. 2A-2B may be similar to the vertical portion 110 the TL-LGA socket of FIG. 1. Note that FIGS. 2A-2B only shows the vertical portions for simplicity and illustration purposes of the coaxial cable designs, but the TL-LGA socket includes additional components (e.g., cantilevers, pads, base layer, housing body, etc.).

For some embodiments, the vertical portions 210a-b and 211 of the TL-LGA socket have vertical cylindrical shapes, where the vertical portions 210a-b and 211 are positioned as transmission lines representing a coaxial cable design. The coaxial cable design implemented in the TL-LGA socket reduces the need for socket height reduction. The coaxial cable has an inner conductor (e.g., signal pin 211) and one or more outer conductors (e.g., adjacent ground pins 210a of FIG. 2A, and/or the ground PTHs 240 of FIG. 2B). Note that, as shown in FIGS. 2A-2B, the vertical portions 210a-b and 211 are positioned with a coaxial design that also has a cascaded pattern/configuration, but the vertical portions may be positioned to have any desired shape, pattern, and/or design based on the needed packaging design and application.

Referring now to FIG. 2A, the coaxial cable 200 has a plurality of vertical portions with ground pins 210a and the signal pin 211. For one embodiment, the signal pin 211 is the inner conductor which may be illustrated as a signal socket interconnect (pin/contact). The signal pin 211 (or the vertical portion with the signal pin) may be surrounded with the ground pins 210a (or the adjacent vertical portions with the ground pins). For some embodiments, the adjacent signal pins 210a are ground references and form the outer conductor illustrated as adjacent ground references (shown with a pattern of closely-spaced diagonal stripes in a backslash direction). Note that the outer conductor may be formed with five adjacent ground pins 210a, but may include more or less than five adjacent ground pins based on the desired packaging design. Accordingly, the first coaxial cable 200 has the outer conductor (shown as having a "D" value/length) and the inner conductor (shown as having a "d" value/radius). The characteristic impedance of the coaxial cable is determined by the outer "D" value and the inner "d" radius of the conductors. The values of "D" and "d" of the TL-LGA socket are selected and disposed based on, but not limited to, the impedance target, the various ground reference scenarios (e.g., one ground reference scenario is shown in FIG. 2A, and another ground reference scenario is shown in in FIG. 2B), the housing material dielectric constant, the pin-to-pin pitch, the pin map pattern (e.g., cascading pattern), and the overall interconnect shape/design.

Note that the first coaxial cable 200 of the TL-LGA socket of FIG. 2A may include fewer or additional packaging components based on the desired packaging design.

Referring now to FIG. 2B, the second coaxial cable 250 has a plurality of vertical portions with signal pins 210b and the signal pin 211, including the adjacent signal pins 210b surrounding the ground PTHs 240 which surround the signal pin 211. Note that-unlike the ground vertical portions 210a of FIG. 2A—the vertical portions 210b are signal pins (shown with a pattern of intersecting diagonal stripes) and not ground references. For one embodiment, the signal pin 211 is the inner conductor which may be illustrated as a signal socket interconnect. The signal pin 211 may be surrounded with the ground PTHs 240 and the adjacent signal pins 210b. For some embodiments, the signal pins 210b may be used as additional transmission lines rather than as ground references, which may maximize the bandwidth and data rate speeds of the TL-LGA socket.

According to some embodiments, the ground PTHs 240 are ground references and form the outer conductor illustrated as smaller adjacent PTHs (shown with a pattern of closely-spaced diagonal stripes in a backslash direction). For one embodiment, the inter-stitched ground PTHs 240 may be plated holes/vias (e.g., drilled holes) disposed on a top surface (or a top conductive layer) of a housing body that are closely-spaced, grounded, and coupled together as ground references. Accordingly, the second coaxial cable 250 has the outer conductor (shown as having a "D" value/length) and the inner conductor (shown as having a "d" value/radius). This second coaxial cable 250 design provides additional pin-to-pin crosstalk reduction benefit, as the characteristic impedance of the TL-LGA socket is changed, by reducing the value of "D" and still maintaining the coaxial design with the cascading pattern.

Note that the second coaxial cable 250 of the TL-LGA socket of FIG. 2B may include fewer or additional packaging components based on the desired packaging design. Also note that the TL-LGA socket of FIG. 2B may be different than the TL-LGA socket of FIG. 2A, even if both TL-LGA sockets include similar packaging/socket components.

FIG. 3A is a top, perspective view of a package 350 having a base layer 301 with a pad 330, and a TL-LGA socket 300 including a housing body 302, a conductive layer 302a, and an interconnect 303 (or a transmission line) having a vertical portion 310 and a cantilever 320, according to one embodiment. FIG. 3B is a cross-sectional view of the package 350 having the base layer 301 with the pad 330, and the TL-LGA socket 300 including the interconnect 303 with the cantilever 320 and the conductive layer 302a of the housing body 302, according to one embodiment. The TL-LGA socket 300 of FIGS. 3A-3B may be similar to the TL-LGA sockets of FIGS. 1 and 2A-2B. Note that FIGS. 3A-3B only shows portions of the TL-LGA socket 300 for illustrative simplicity, but the TL-LGA socket 300 may include additional components.

For some embodiments, the TL-LGA socket 300 may include a plurality of interconnects 303, but for illustrative simplicity, a portion of a single interconnect 303 (e.g., similar to the interconnect 100 of FIG. 1) is shown. Each of the plurality of interconnects 303 of the TL-LGA socket 300 may include the vertical portion 310 (note that only the top end is shown in FIG. 3A) and the cantilever 320 (or a horizontal portion), and the cantilever coupled to the pad 330 of the package 350. According to some embodiments, the TL-LGA socket 300 may include a housing body 302 having a top surface, such as the conductive layer 302a) and a bottom surface (not shown) that is opposite from the top surface, as each of the vertical portions (e.g., vertical portion 310) of the plurality of interconnects 303 is disposed in the housing body 320. Additionally, for some embodiments, the plurality of interconnects 303 of the TL-LGA socket 300 may be disposed in the housing body 302 to form a plurality of cascaded transmission lines 303 (e.g., as shown in FIG. 4). For some embodiments, the top surface of the housing body 302 is a conductive layer 302a that has one or more openings 306, where the openings 306 are positioned above the top end of the vertical portions 310.

For one embodiment, the package 350 may include a base layer 301 (or a bottommost layer/surface of the package 350) having a plurality of corresponding pad openings 305 and a plurality of pads 330, where the base layer 301 is disposed above the top conductive layer 302a of the housing body 302. Accordingly, the vertical portion 310 and the cantilever 320 of the TL-LGA socket 300 are coupled to the pad 330 of the base layer 301 of the package 350, thereby implementing/forming a transmission line 303.

For one embodiment, the TL-LGA socket 300 may be a LGA device/socket that has been disposed/formed with cascaded transmission line 303 structures to improve (or maximize) the bandwidth and data rate speeds of the TL-LGA socket 300. Additionally, the base layer 301 has one or more pad openings 305, where each of the pad openings 305 houses one of the pads 330 of the plurality of TL-LGA interconnects 303. For example, the TL-LGA transmission line 303 may have the vertical portion 310 extend in the housing body 302 from or near the conductive layer 302a to the bottom surface (not shown), where the top end of the vertical portion 302 may couple to the cantilever 320 with a connector 321, and the bottom end of the vertical portion 302 may couple to a solder ball (e.g., as shown in FIGS. 5A-5B). As such, for these embodiments, the cantilever 320 is disposed between the base layer 301 of the package 350 and the conductive layer 302a of the housing body 302 (i.e., the cantilever 320, the base layer 301, and the conductive layer 302a of the housing body 302 are parallel to each other, as shown in FIG. 3B). Based on this parallel design/structure of the transmission line (or interconnect), the cantilever 320 may be implemented/designed to be at least one of a stripline and a microstrip based on the ground references of the TL-LGA socket 300.

As shown in FIGS. 3A-3B, the cantilever 320 may be a stripline as the ground references are on both the base layer 301 and the conductive layer 302a of the housing body 302 (i.e., the base layer 301 and the conductive layer 302a are both grounded). For one embodiment, the transmission line 303 of the TL-LGA socket 300 has one end of the cantilever 320 coupled to the top end of the vertical portion 310 with the connector 321, and the opposite end of the cantilever 320 is coupled to the pad 330 of the package 350 with a connector 322. For one embodiment, the package 350 has a plurality of pad openings 305 that are formed with a cascading pattern, where the pad opening 305 may surround the pad 330 of the base layer 301 that is coupled to the cantilever 320. The base layer 301 may have a gap opening 309 (e.g., an opening of roughly 50 um) between the outer edge of the pad 330 and the inner edge of the pad opening 305. The size of the gap opening 309 may be implemented based on the desired packaging design and electrical characteristics.

Referring now to FIG. 3B, the TL-LGA socket 300 illustrates the cantilever 320 portion of the interconnect 303, and the opening 306 on the conductive layer 302a of the housing body 302 that is used to connect to the vertical portion 310. The cantilever 320 may be disposed in the air between the base layer 301 and the conductive layer 302a of the housing body 302, as such the cantilever 320, the base layer 301, and the conductive layer 302a are parallel to each other. In one embodiment, when the interconnect 303 is loaded, the interconnect 303 may be in a flat/horizontal position with the weight (or force) of the package 350 pressing down on the horizontal portion 620 of the loaded interconnect 303.

In one embodiment, the cantilever 320 may be surrounded by a ground conductive layer 302a of the housing body 302 and a grounded base layer 301, thereby the cantilever 320 is a stripline. For one embodiment, the cantilever 320 may have a rectangular shape, but the cantilever may also be formed with any other design (e.g., a socket pin as shown in FIGS. 5A-5B) and have any other shape (e.g., cylindrical). Note that, when the ground reference is only disposed on the base layer of the package, the cantilever may be a microstrip. Also note, when the ground reference is disposed on both the base layer of the package and the top surface of the housing body, the cantilever may be a stripline.

Note that the TL-LGA socket 300 of FIGS. 3A-3B may include fewer or additional packaging components based on the desired packaging design.

FIG. 4 is a top, perspective view of a TL-LGA socket 400 having a housing 402, a plurality of transmission lines 403, and a plurality of solder balls 405, according to one embodiment. The TL-LGA socket 400 of FIG. 4 may be similar to the TL-LGA sockets of FIGS. 1, 2A-2B, and 3A-3B (e.g., the TL-LGA socket 300). Note that FIG. 4 only shows a portion of the TL-LGA socket 400 and omits other components of the TL-LGA socket 400 to simplify the illustration, as such the TL-LGA socket 400 may include additional components.

As shown in FIG. 4, the TL-LGA socket 400 includes a plurality of transmission lines 403 disposed in the housing body 402 as the transmission lines 403 are patterned to form the plurality of cascaded transmission lines 403. The TL-LGA socket 400 helps to improve the LGA technologies and designs by approximating each critical portion of the socket pin (or the TL-LGA interconnect) as cascaded transmission lines 403 in the housing body 402.

The TL-LGA socket 400 may include a plurality of vertical portions 410, each vertical portion 410 extending from the bottom surface to the conductive layer 402a (or the top surface) of the housing 402. For one embodiment, the bottom end of the vertical portion 410 is coupled to a solder ball 405, and the top end of the vertical portion 410 is coupled to a connector 421. The connector 421 may be coupled to the cantilever 420, and the cantilever 420 may be coupled to a connector 422. For one embodiment, the connector 422 is coupled to a pad 430 which is surrounded by an opening (not shown) in a base layer 401 of a package 450. Additionally, the solder ball 405 of the TL-LGA socket 400 may be coupled with a substrate 451.

According to some embodiments, the substrate 451 may include, but is not limited to, a package substrate, a substrate, a printed circuit board (PCB), and a motherboard. For one embodiment, the substrate 451 is a PCB. For one embodiment, the PCB is made of an FR-4 glass epoxy base with thin copper foil laminated on both sides (not shown). For certain embodiments, a multilayer PCB can be used, with pre-preg and copper foil (not shown) used to make additional layers. For example, the multilayer PCB may include one or more dielectric layers, where each dielectric layer can be a photosensitive dielectric layer (not shown). For some embodiments, holes (not shown) may be drilled in the PCB 451. For one embodiment, the PCB 451 may also include conductive copper traces, metallic vias/pads, and holes (not shown).

Note that the TL-LGA socket 400 of FIG. 4 may include fewer or additional packaging components based on the desired packaging design.

FIG. 5A is a top, perspective view of a transmission line 503 of a TL-LGA socket 500 having a vertical portion 510, a cantilever 520, a contact 530, and a solder ball 505, according to one embodiment. FIG. 5B is a cross-sectional view of a transmission line 503 of the TL-LGA socket 500 having the vertical portion 510, the cantilever 520, the contact 530, and the solder ball 505 according to one embodiment. The TL-LGA socket 500 of FIG. 5 may be similar to the TL-LGA sockets of FIGS. 1, 2A-2B, 3A-3B, and 4. Note that FIG. 5 only shows a portion of the TL-LGA socket 500 and may omit other components of the TL-LGA socket 500 to simplify the illustration, as such the TL-LGA socket 500 may include additional components (e.g., a base layer).

FIG. 5A illustrates a socket pin 511 disposed in the vertical portion 510, according to some embodiments. The socket pin 511 may be coupled to the cantilever 520, and the cantilever 520 may be coupled to the socket contact 530. For some embodiments, the geometry (or design) of the cantilever 520 portion can be further tuned (i.e., the cantilever portion may have other shapes notwithstanding a rectangular, horizontal portion) as long as the impedance profile remains unchanged. FIG. 5B illustrates the socket pin 511 extending the z-height of the vertical portion 520, as the socket pin 511 is coupled to the solder ball 505 and the cantilever 520, which protrudes from inside the vertical portion 520 through an opening 506 in the conductive layer 502a (or the top surface) of the housing body 502.

Note that the TL-LGA socket 500 of FIGS. 5A-5B may include fewer or additional packaging components based on the desired packaging design.

Figure 6A:
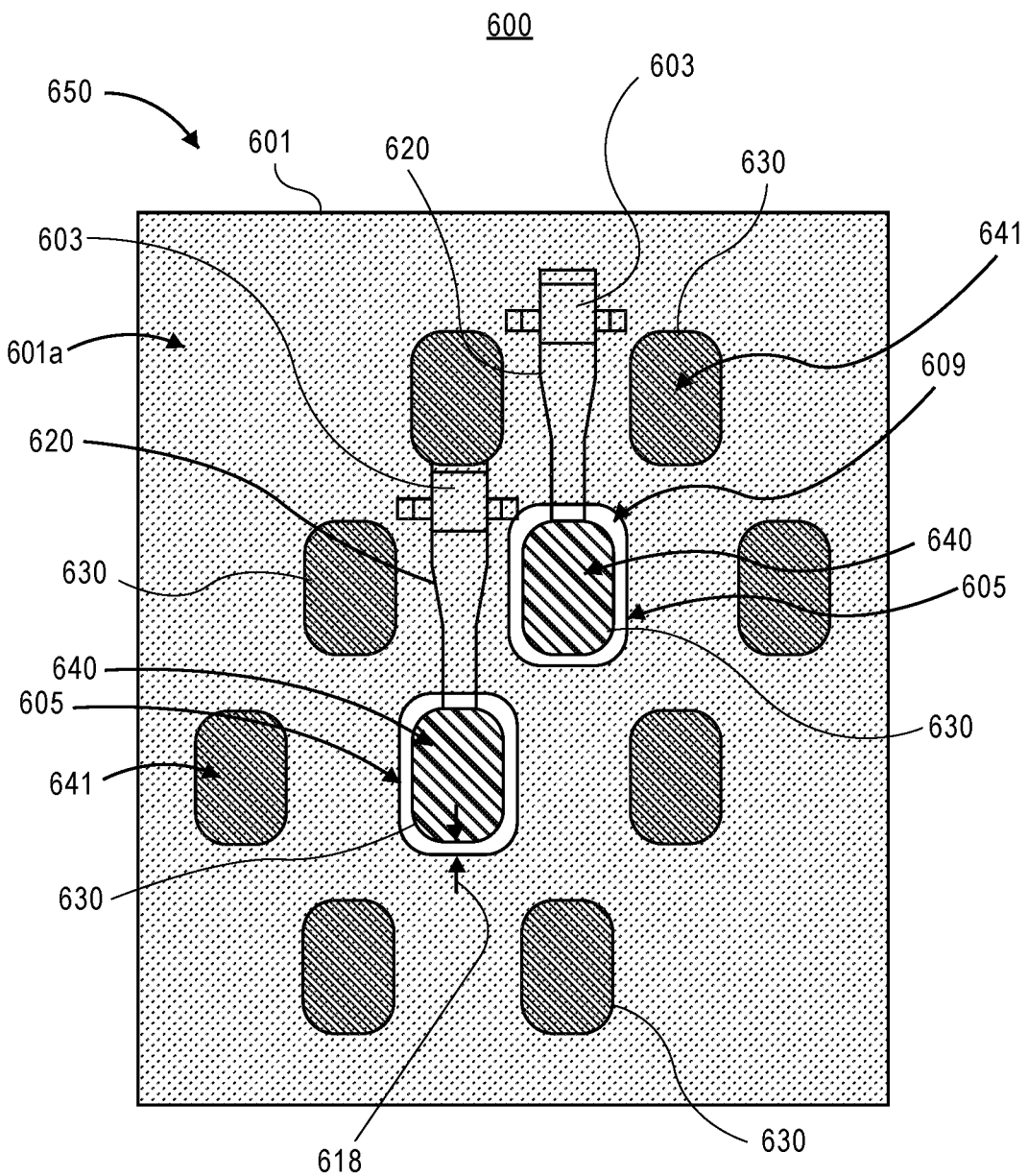
FIG. 6A is a plan view of a package with a base layer that includes a flooded ground plane, a plurality of pads, and a plurality of pad openings, and a TL-LGA socket including a plurality of TL-LGA interconnects with horizontal portions, according to embodiment.
Figure 6B:
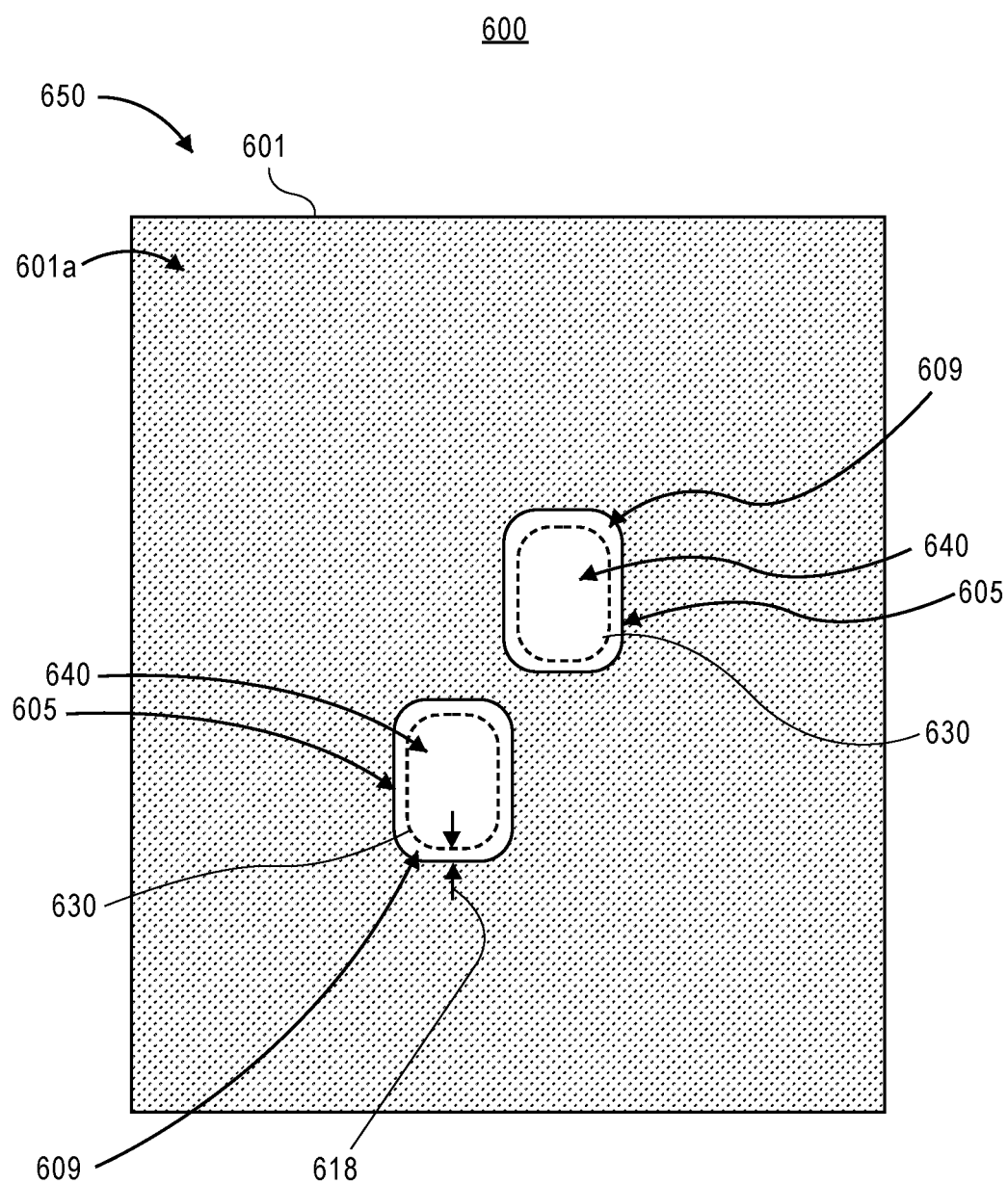
FIG. 6B is a plan view of a package with a base layer that includes a flooded ground plane, a plurality of pads, and a plurality of pad openings, according to embodiment.

FIG. 6A is a plan view of a TL-LGA socket assembly having a package 650 with a base layer 601 that includes a flooded ground plane 601a, a plurality of pads 630, and a plurality of corresponding pad openings 605, and a TL-LGA socket including a plurality of TL-LGA interconnects 603 with horizontal portions 620, according to embodiment. FIG. 6B is a plan view of only the package 650 with the base layer 601 that includes the flooded ground plane 601a, the plurality of pads 630, and the plurality of corresponding pad openings 605, according to embodiment. The TL-LGA socket of the TL-LGA socket assembly 600 of FIG. 6A may be similar to the TL-LGA sockets of FIGS. 1-5. Note that FIGS. 6A-6B only shows a portion of the TL-LGA socket assembly 600 and may omit other components of the TL-LGA socket and the package to simplify the illustration, as such the TL-LGA socket assembly 600 may include additional components (e.g., a housing body, a vertical portion, an IC die, etc.).

For one embodiment, the TL-LGA socket assembly 600 includes an interconnect 603 with a horizontal portion 620 of the TL-LGA socket. The interconnect 603 may include a solder ball, a vertical portion, and a horizontal portion 620 (e.g., as shown in FIG. 1). For an additional embodiment, the TL-LGA socket assembly 600 further includes a package 650 (or a package substrate) with a base layer 601, where the base layer 601 includes pads 630 and corresponding pad openings 605. The base layer 601 of the package 650 may be disposed as the bottommost layer of the package 650 and disposed above a conductive layer of a housing body of the TL-LGA socket (e.g., as shown in FIGS. 3A-3B and 8). The pads 630 on the base layer 601 may be signal pads 640 and/or grounded pads 641. For one embodiment, the horizontal portion 620 of the interconnect 603 (or a transmission line) may be coupled to the signal pad 640 on the base layer 601, as the ground plane 601a (or the flooded ground plane) floods the base layer 601 with a ground reference(s) ant the flooded ground plane 601a is disposed above and parallel to the horizontal portion 620 of the interconnect 603 to create the transmission line structures of the TL-LGA socket assembly 600.

As used herein, a "flooded ground plane" refers to a ground plane with a ground reference (e.g., a ground plate, a ground contact/pin, ground, etc.), which floods the base layer of the package to be grounded with voids (or openings) around one or more pads (e.g., the signal pads 640, power pads, etc.). For example, the flooded ground plane 601a may be coupled to the ground pads 641 on the base layer 601, where the flooded ground plane 601a may include pad openings 605 to surround signal pads 640.

For some embodiments, the TL-LGA socket assembly 600 may include the package 650 having the pads 630 with a LGA pad area reduction of greater than roughly 50% of existing LGA pad sizes (e.g., the pads 630 may have a pad area reduction of greater than roughly 50% a LGA pad with dimensions of roughly 0.33 mm×0.40 mm), which allows the flooded ground plane 601a to flood (or couple) the non-signal land pad area with ground (i.e., the land pad area of the pads 630 have been reduced by 50% or more). For example, rather than typically attaining the electrically desired ground area by using larger LGA ground pads, the package 650 of the TL-LGA socket assembly 600 may reduce the LGA land pad area of each pad 630 by using the ground reference of the flooded ground plane 601a—and thus enabling the land pad area of the pads 630 to be reduced.

For some embodiments, the TL-LGA socket assembly 600 may have a single-sided ground reference for the horizontal portion 620 that enables the horizontal portion 620 of the interconnect/transmission line 603 to have microstrip electrical characteristics, which helps improve the loss/reflection/impedance electrical performances of the TL-LGA socket assembly 600. For example, with the flooded ground plane 601a, the impedance discontinuity of the pads 630 of the TL-LGA socket assembly 600 may be reduced by 21 Ohms (or more than 21 Ohms) as compared to an existing LGA pad. For one embodiment, the signal pad 640 may be coupled to the horizontal portion 620 forming the interconnect 603 that transmits a signal. Likewise, for one embodiment, the ground pads 641 may be coupled to the flooded ground plane 601a of the base layer 601 on the package 650. In one embodiment, the flooded ground plane 601a may surround the pad openings 605 and the signal pads 640, leaving gap openings 609 between the signal pads 640 and the corresponding pad openings 605. For one embodiment, the gap openings 609 may have an opening length 618 of less than roughly 50 um between the signal pads 640 and the corresponding pad openings 605.

For one embodiment, the flooded ground plane 601a on the base layer 601 may be coupled to the ground pads 641. In this embodiment, the flooded ground plane 601a is parallel to the horizontal portions 620, which allows the horizontal portion 620 and the vertical portion to form the transmission line 603 of the TL-LGA socket assembly 600. Additionally, the TL-LGA socket assembly 600 improves packaging solutions by avoiding additional plating processes using the flooded ground plane 601a on the base layer 601, which reduces the assembly time, reduces cost and risks, and improves the data rate speeds and bandwidth of the TL-LGA socket assembly 600.

FIG. 6B omits one or more components and only shows the top view of the package 650 with the base layer 601 of the TL-LGA socket assembly 600 to simplify the illustration. For one embodiment, the signal pads 640 are shown with a dashed line to illustrate their position on the base layer 650. Note that, the flooded ground plane 601a of the base layer may be formed of a conductive material (e.g., Cu or the like).

Note that the TL-LGA socket assembly 600 of FIGS. 6A-6B may include fewer or additional packaging components based on the desired packaging design.

FIG. 7A is a plan view of a TL-LGA socket assembly 700 including a package 750 with a base layer 701 having a plurality of ground strips 751a-b and a plurality of pads 730, and a TL-LGA socket with a plurality of TL-LGA interconnects 703 having horizontal portions 720, according to embodiment. FIG. 7B is a plan view of the TL-LGA socket assembly 700 including the package 750 having the base layer 701 that includes the ground strips 751a-b and the signal pads 740, according to embodiment. The TL-LGA socket of the TL-LGA socket assembly 700 of FIG. 7A may be similar to the TL-LGA sockets of FIGS. 1-6A, but the TL-LGA socket assembly 700 of FIGS. 7A-7B further includes ground strips 751a-b that are selectively disposed above the horizontal portions 720 of the high-speed interconnects 703 (or high-speed socket signals/pins). For example, instead of the TL-LGA socket assembly 600 of FIGS. 6A-6B which includes the flooded ground plane 601a on the base layer 601 of the package 650, the TL-LGA socket assembly 700 of FIGS. 7A-7B includes reduced/isolated ground pads 741 and selectively positioned ground strips 751a-b that are disposed only above the horizontal portions 720 of the high-speed interconnects 703. Note that, as shown in FIGS. 7A-7B, two ground strips 751a-b are illustrated, but a package of the TL-LGA socket assembly may have one or more grounds strips based on the desired packaging design. Also note that FIGS. 7A-7B only shows a portion of the TL-LGA socket assembly 700 and may omit other components of the TL-LGA socket assembly 700 to simplify the illustration, as such the TL-LGA socket assembly 700 may include additional components (e.g., a housing body, a vertical portion, an IC die, etc.).

For one embodiment, the TL-LGA socket assembly 700 includes an interconnect 703 of the TL-LGA socket (e.g., as shown in FIGS. 1, 3A-3B, 4, 5A-5B, and 8). The interconnect 703 may include a vertical portion coupled to a horizontal portion 720 (e.g., as shown in FIG. 1). In one embodiment, the TL-LGA socket assembly 700 also includes a package 750 having a base layer 701 which includes pads 730 and ground strips 751a-b. For one embodiment, the pads 730 may include, but is not limited to, signal pads 740, ground pads 741, and power pads. According to one embodiment, the TL-LGA socket assembly 700 further includes the ground strips 751a-b that are on the base layer 701, where the ground strips 751a-b are positioned over the horizontal portions 720 of the interconnects 703 and are adjacent to the signal pads 740, and where the horizontal portions 720 of the interconnects 703 of the TL-LGA socket are coupled to the signal pads 740.

As shown in FIGS. 7A-7B, the ground reference of the base layer 701 is not flooded throughout the base layer 701, rather the ground strips 751a-b are only selectively formed on the base layer 701 and positioned above the horizontal portions 720 of the high-speed interconnects 703. The TL-LGA socket assembly 700 thus reduces the impedance discontinuity that may be caused by the ground of the base layer 701, while still maintaining the ground reference needed for the horizontal portions 720 to create the transmission lines 703 (or interconnects).

For one embodiment, the width 729 of the ground strips 751a-b may need to extend beyond the width of the horizontal portions 720 while also leaving enough space, such as the gap opening 719, for the adjacent signal pads 741. For one embodiment, the width 729 of the ground strips 751a-b may less than roughly 400 um. For one embodiment, the length of the ground strips 751a-b may vary based on the length of the horizontal portions 720, as the ground strips 751a-b may need to cover most of the length of the horizontal portions 720 while accounting the length of the gap openings 719 between the signal pads 740 and the horizontal portion 720.

For an additional embodiment, the length of the ground strip 751a may need to extend over a majority of the length of the horizontal portion 720, but the edge of the ground strip 751a closest/nearest to the respective signal pad 740 may need to leave the gap opening 719 of roughly 250 um or greater to the respective signal pad 740 (note that, as shown in FIGS. 7A-7B, the edge of the ground strip 751a that is closest to the respective signal pad 740 is the bottommost edge of the ground strip 751a). For example, as shown in FIGS. 7A-7B with the double-side arrows, the gap opening 719 is measured from the edge of the signal pad 740 to the closest/adjacent edge of the ground strip 751a.

In some embodiments, the ground strips 751a-b may be connected/coupled to one of the adjacent ground pads 741 in, but not limited to, a longitudinal direction/axis and an orthogonal direction/axis. For one embodiment, the pads 730 and the ground strips 751a-b are formed/plated with a conductive material (e.g., Cu or the like) on the same bottommost base layer 701 of the package 750, where the unoccupied area on the base layer 701 (shown as the white unoccupied space in FIG. 7A) may include a solder resist, a solder mask, and/or the like. For another embodiment, the base layer 701 may be formed of one or more stacked layers, where the ground strips may be formed on one layer disposed on (above and/o below) another layer having the pads. For example, the ground strips 751a-b may be coupled to one of the adjacent ground pads 741 using any desired method, which is allowed by package design and manufacturing rules. For one embodiment, the ground strips 751a-b are coupled using two methods: (i) the ground strip 751a is coupled in a longitudinal direction/axis with the ground pad 741 as the topmost edge of the ground strip 751a couples the bottom surface of the ground pad 741; and (ii) the ground strip 751b is coupled in an orthogonal direction/axis with the ground pad 741 as the right edge of the ground strip 751b couples the left side edge of the ground pad 741 with a ground via 718 (or a conductive line/trace). For one embodiment, the ground strips 751a-b may have rounded corners.

For some embodiments, by reducing the area of the needed ground references (such as the ground pads) using the selectively positioned ground strips 751a-ab, the TL-LGA socket assembly 700 may decrease the area of each pad 730 in the base layer 701 of the package 750 (e.g., the pads may have dimensions of less than roughly 0.15 mm (+/−0.05 mm)×0.20 (+/−0.05 mm)). Moreover, the ground strips 751a-b are selectively disposed above the horizontal portions 720 to provide a reduced impedance discontinuity (e.g., the impedance discontinuity of the pads 730 of the TL-LGA socket assembly 700 may be reduced by 5 Ohms (or more than 5 Ohms) as compared to the pads 630 the TL-LGA socket 600 with the flooded ground plane 601a). In addition, implementing the ground strips 751a-b of the TL-LGA socket assembly 700 helps to achieve a reduced land pad capacitance, an improved impedance match, and an improved reduced loss/reflection/impedance performance for the TL-LGA socket to support PCIe G5 data rate speeds—while the grounds strips 751a-b may be formed with any conventional package design rules and layout processes with no additional design or manufacturing risks.

FIG. 7B omits one or more components and only shows the top view of the package 750 with the base layer 701 of the TL-LGA socket assembly 700 to simplify the illustration. For one embodiment, the signal pads 740 are shown with a dashed line to illustrate their position on the base layer 750. Note that, the ground strips 751a-b on the base layer 701 may be formed of a conductive material (e.g., Cu or the like) that is coupled to the ground reference(s) of the TL-LGA socket assembly 700.

Note that the TL-LGA socket assembly 600 of FIGS. 6A-6B may include fewer or additional packaging components based on the desired packaging design.

FIG. 8 is a cross-sectional view of an assembly 800 having an integrated circuit die 814, a package substrate 850 with a base layer 801, a TL-LGA socket 860, and a substrate 851, according to one embodiment. For one embodiment, the assembly 800 may include a TL-LGA socket assembly that may include the integrated circuit die 814, the package substrate 850, and the TL-LGA socket 860. In addition, FIG. 8 is a cross-sectional view of a semiconductor packaged assembly 800 having the TL-LGA socket 860 to couple integrated circuit die 814 and the package substrate 850 to the substrate 851, such as a PCB, according to one embodiment. Note that the package substrate 850 and the TL-LGA socket 860 may be similar to the packages and the TL-LGA sockets of FIGS. 1-7 as described herein.

For one embodiment, the assembly 800 includes the integrated circuit die 814 coupled to the package substrate 850, where the package substrate 850 includes a conductive base layer 801, the conductive base layer 801 includes a plurality of pads 830 and a plurality of corresponding pad openings 805 surrounding the plurality of pads 830, where each pad opening 805 has an opening gap 809 between the corresponding pad opening 805 and the pad 830. For one embodiment, the die 814 may be coupled directly to the package substrate 850 or coupled to the package substrate 850 via an interposer 812.

For one embodiment, the assembly 800 also includes the TL-LGA socket 860 coupled to the package substrate 850. For one embodiment, the TL-LGA socket 860 includes a plurality of interconnects, each of the plurality of interconnects includes a vertical portion 810 and a horizontal portion 820. For one embodiment, the horizontal portions 820 may include connectors 821 and 822. For one embodiment, the TL-LGA socket 860 also includes a housing body 802 having a top surface and a bottom surface that is opposite from the top surface, where the top surface is a conductive layer 802a having a plurality of openings, where the vertical portions 810 of the plurality of interconnects are in the housing body 802, and where the plurality of interconnects are positioned in the housing body 802 in a cascaded configuration, where the conductive base layer 801 of the package substrate 850 is above the conductive layer 802a of the housing body 802, where the horizontal portion 820 is between the conductive base layer 801 of the package 850 and the conductive layer 802a of the housing body 802, where the horizontal portion 820 is parallel to the conductive base layer 801 of the package 850 and the conductive layer 802a of the housing body 802, and where the horizontal portion 820 is coupled to the vertical portion 810 and coupled to a corresponding pad 830 on the conductive base layer 801 of the package substrate 850.

According to one embodiment, the semiconductor packaged assembly 800 is merely one example of an embodiment wherein an integrated circuit die 814 is coupled to a substrate 812 (e.g., an interposer) via one or more bumps/joints formed from respective microbumps. As described above, a solder joint formed by soldering of a microbump according to an embodiment may itself be referred to as a "bump" and/or a "microbump."

For some embodiments, the semiconductor packaged assembly 800 may have a die 814 disposed on an interposer 812, where both the stacked die 814 and interposer 812 are disposed on a package substrate 850. For one embodiment, the die 814 may include, but is not limited to, a semiconductor die, an electronic device (e.g., a wireless device), an integrated circuit, a central processing unit (CPU), a microprocessor, a platform controller hub (PCH), a memory, and a field-programmable gate array (FPGA). The die 814 may be formed from a material such as silicon and have circuitry thereon that is to be coupled to the interposer 812. Although some embodiments are not limited in this regard, the package substrate 850 may in turn be coupled to another body, for example, a substrate 851 such as a computer motherboard via the TL-LGA socket 860. One or more connections between the TL-LGA socket 860, the substrate 851, the package substrate 850, the interposer 812, and the die 814—e.g., including some or all of bumps 805, 816, and 818—may include one or more interconnect structures and underfill layers 826 and 828. In some embodiments, these interconnect structures (or connections) may variously comprise an alloy of nickel, palladium, and tin (and, in some embodiments, Cu).

Connections between the package substrate 850 and another body may be made using any suitable structure, such as the interconnects of the TL-LGA socket 860. The package substrate 850 may include a variety of electronic structures formed thereon or therein. The interposer 812 may also include electronic structures formed thereon or therein, which may be used to couple the die 814 to the package substrate 850. For one embodiment, one or more different materials may be used for forming the package substrate 850 and the interposer 812. In certain embodiments, the package substrate 850 is an organic substrate made up of one or more layers of polymer base material, with conducting regions for transmitting signals. In certain embodiments, the interposer 812 is made up of a ceramic base material including metal regions for transmitting signals. Although some embodiments are not limited in this regard, the assembly 800 may include gap control structures 830—e.g., positioned between the package substrate 850 and the interposer 812. Such gap control structures 830 may mitigate a change in the height of the gap between the package substrate 850 and the interposer 812, which otherwise might occur during reflowing while die 814 is attached to interposer 812. Note that the assembly 800 includes an underflow material 828 between the interposer 812 and the die 814, and an underflow material 826 between the package substrate 850 and the interposer 812. The underflow materials (or layers) 826 and 828 may be one or more polymers that are injected between the layers.

According to some embodiments, the TL-LGA socket 860 may be coupled to the substrate 851 with solder balls 805. For one embodiment, the substrate 851 may include, but is not limited to, a package, a substrate, a printed circuit board (PCB), and a motherboard. For one embodiment, the substrate 851 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer can be a photosensitive dielectric layer. For some embodiments, holes may be drilled in the PCB 851. For one embodiment, the PCB 851 may also include conductive copper traces, metallic pads, and holes.

Note that the assembly 800 may include fewer or additional packaging components based on the desired packaging design.

Figure 9:
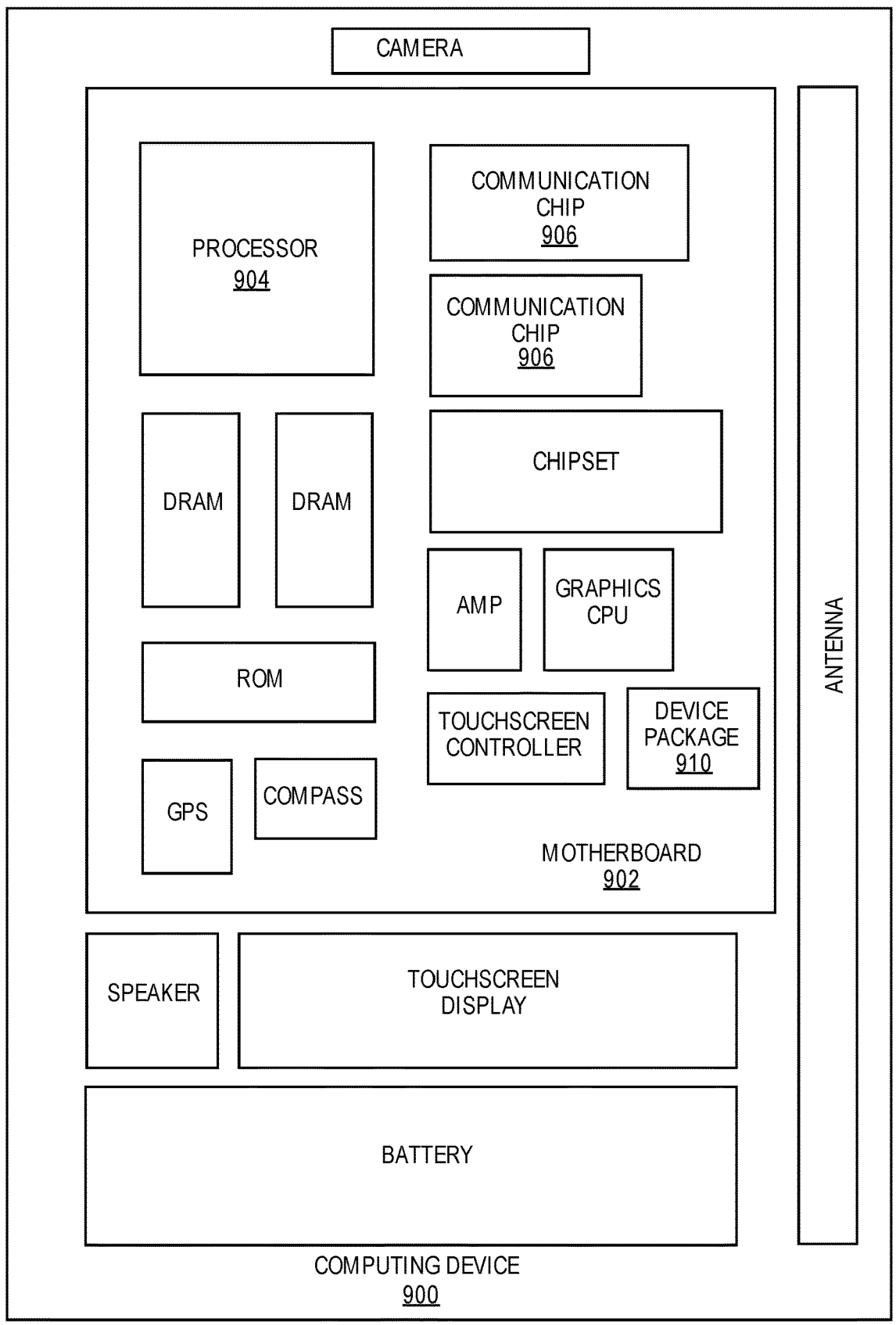
FIG. 9 is a schematic block diagram illustrating a computer system that utilizes a device package having a TL-LGA socket assembly, according to one embodiment.

FIG. 9 is a schematic block diagram illustrating a computer system 900 that utilizes a device package 910 with a TL-LGA socket assembly and/or a TL-LGA socket that has one or more transmission lines, according to one embodiment. FIG. 9 illustrates an example of computing device 900. Computing device 900 houses motherboard 902. For one embodiment, motherboard 902 may be similar to the substrate 451 and 851 of FIGS. 4 and 8. Motherboard 902 may include a number of components, including but not limited to processor 904, device package 910 (or semiconductor package), and at least one communication chip 906. Processor 904 is physically and electrically coupled to motherboard 902. For some embodiments, at least one communication chip 906 is also physically and electrically coupled to motherboard 902. For other embodiments, at least one communication chip 906 is part of processor 904.

Depending on its applications, computing device 900 may include other components that may or may not be physically and electrically coupled to motherboard 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 906 enables wireless communications for the transfer of data to and from computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

Processor 904 of computing device 900 includes an integrated circuit die packaged within processor 904. Device package 910 may include, but is not limited to, one or more of a package, a substrate, and/or a PCB. Device package 910 may include an IC package coupled to a PCB using a TL-LGA socket (e.g., the TL-LGA sockets of FIGS. 1-7)— or any other components from the figures described herein— of the computing device 900. Further, as described herein, the device package 910 helps improve the bandwidth, data rate speeds, and improved loss/reflection/impedance performance of the computing device 900 by reducing the pad sizes and disposing a plurality of cascaded transmission lines, a flooded ground plane, and/or a ground strip in/on the TL-LGA socket assembly.

Note that device package 910 may be a single component/device, a subset of components, and/or an entire system, as the materials, features, and components may be limited to device package 910 and/or any other component of the computing device 900 that may need TL-LGA sockets (e.g., the motherboard 902 and/or any other component of the computing device 900 may use the TL-LGA package as described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 906 also includes an integrated circuit die packaged within the communication chip 906. For some embodiments, the integrated circuit die of the communication chip may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a transmission line-land grid array (TL-LGA) socket assembly, comprising: a TL-LGA socket having an interconnect in a housing body, the interconnect includes a vertical portion and a horizontal portion. The housing body has a top surface and a bottom surface that is opposite from the top surface, wherein the top surface is a conductive layer; and a package having a base layer, the base layer includes a signal pad and a ground strip. The base layer is above the conductive layer of the housing body of the TL-LGA socket. The ground strip is above the horizontal portion of the interconnect of the TL-LGA socket. The horizontal portion is coupled to the signal pad on the base layer.

In example 2, the subject matter of example 1 can optionally include a width of the ground strip greater than a width of the horizontal portion. The ground strip is adjacent to the signal pad.

In example 3, the subject matter of any of examples 1-2 can optionally include a gap between the ground strip and the signal pad.

In example 4, the subject matter of any of examples 1-3 can optionally include the ground strip coupled to a ground pad on the base layer.

In example 5, the subject matter of any of examples 1-4 can optionally include the ground strip having a rectangular shape. The ground strip includes at least one of a rounded corner and a perpendicular corner.

In example 6, the subject matter of any of examples 1-5 can optionally include the ground strip coupled to the ground pad in at least one of a longitudinal axis and an orthogonal axis. The ground strip is coupled to the ground pad in the orthogonal axis with a ground via.

In example 7, the subject matter of any of examples 1-6 can optionally include the horizontal portion of the interconnect is parallel to the ground strip on the base layer to create a microstrip.

In example 8, the subject matter of any of examples 1-7 can optionally include the signal and ground pads on the base layer have a reduced pad area.

In example 9, the subject matter of any of examples 1-8 can optionally include the base layer having a flooded ground plane, the flooded ground plane is coupled to at least one of a ground reference and the ground pad. The flooded ground plane has a corresponding pad opening surrounding the signal pad on the base layer. The corresponding pad opening includes a gap between the signal pad and the corresponding pad opening.

Example 10 is a package substrate, comprising: a base layer; and a signal pad and a ground strip on the base layer. The ground strip is adjacent to the signal pad.

In example 11, the subject matter of example 10 can optionally include the ground strip positioned above a horizontal portion of an interconnect of a TL-LGA socket. The horizontal portion is coupled to the signal pad on the base layer. The base layer is above a conductive layer of a housing body of the TL-LGA socket. The interconnect is in the housing body. The interconnect includes a vertical portion coupled to a horizontal portion. The housing body has a top surface and a bottom surface that is opposite from the top surface. The top surface is a conductive layer.

In example 12, the subject matter of any of examples 10-11 can optionally include a width of the ground strip greater than a width of the horizontal portion.

In example 13, the subject matter of any of examples 10-12 can optionally include a gap between the ground strip and the signal pad on the base layer.

In example 14, the subject matter of any of examples 10-13 can optionally include a ground pad on the base layer. The ground pad is coupled to the ground strip.

In example 15, the subject matter of any of examples 10-14 can optionally include the ground strip having a rectangular shape. The ground strip includes at least one of a rounded corner and a perpendicular corner.

In example 16, the subject matter of any of examples 10-15 can optionally include the ground strip coupled to the ground pad in at least one of a longitudinal axis and an orthogonal axis. The ground strip is coupled to the ground pad in the orthogonal axis with a ground via.

In example 17, the subject matter of any of examples 10-16 can optionally include the horizontal portion of the interconnect of the TL-LGA socket is parallel to the ground strip on the base layer to create a microstrip.

In example 18, the subject matter of any of examples 10-17 can optionally include the signal and ground pads on the base layer have a reduced pad area.

In example 19, the subject matter of any of examples 10-18 can optionally include a flooded ground plane on the base layer. The flooded ground plane is coupled to at least one of a ground reference and the ground pad. The flooded ground plane has a corresponding pad opening surrounding the signal pad on the base layer. The corresponding pad opening includes a gap between the signal pad and the corresponding pad opening.

Example 20 is an assembly, comprising: a package substrate; an integrated circuit die coupled to the package substrate. The package substrate includes a base layer. The base layer has a signal pad and a ground strip; and a TL-LGA socket coupled to the package substrate, the (TL-LGA) socket including: an interconnect in a housing body, the interconnect includes a vertical portion and a horizontal portion. The housing body has a top surface and a bottom surface that is opposite from the top surface. The top surface is a conductive layer. The base layer is above the conductive layer of the housing body of the TL-LGA socket. The ground strip is above the horizontal portion of the interconnect of the TL-LGA socket. The horizontal portion is coupled to the signal pad on the base layer.

In example 21, the subject matter of example 20 can optionally include a width of the ground strip greater than a width of the horizontal portion. The ground strip is adjacent to the signal pad. The horizontal portion of the interconnect is parallel to the ground strip on the base layer to create a microstrip.

In example 22, the subject matter of any of examples 20-21 can optionally include a gap between the ground strip and the signal pad.

In example 23, the subject matter of any of examples 20-22 can optionally include the ground strip coupled to a ground pad on the base layer. The ground strip has a rectangular shape.

The ground strip includes at least one of a rounded corner and a perpendicular corner. The ground strip is coupled to the ground pad in at least one of a longitudinal axis and an orthogonal axis. The ground strip is coupled to the ground pad in the orthogonal axis with a ground via.

In example 24, the subject matter of any of examples 20-23 can optionally include the signal and ground pads on the base layer have a reduced pad area.

In example 25, the subject matter of any of examples 20-24 can optionally include the base layer having a flooded ground plane, the flooded ground plane coupled to at least one of a ground reference and the ground pad. The flooded ground plane has a corresponding pad opening surrounding the signal pad on the base layer. The corresponding pad opening includes a gap between the signal pad and the corresponding pad opening.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A transmission line land grid array (TL-LGA) socket assembly, comprising:
    a TL-LGA socket having an interconnect in a housing body, the interconnect includes a vertical portion and a horizontal portion, wherein the housing body has a top surface and a bottom surface that is opposite from the top surface, wherein the top surface is a conductive layer; and
    a package having a base layer, the base layer includes a signal pad and a ground strip, wherein the base layer is above the conductive layer of the housing body of the TL-LGA socket, wherein the ground strip is vertically over the horizontal portion of the interconnect of the TL-LGA socket, and wherein the horizontal portion is coupled to the signal pad on the base layer.

2. The TL-LGA socket assembly of claim 1, wherein a width of the ground strip is greater than a width of the horizontal portion, and wherein the ground strip is adjacent to the signal pad.

3. The TL-LGA socket assembly of claim 1, further comprising a gap between the ground strip and the signal pad.

4. The TL-LGA socket assembly of claim 1, wherein the ground strip is coupled to a ground pad on the base layer.

5. The TL-LGA socket assembly of claim 4, wherein the ground strip is coupled to the ground pad in at least one of a longitudinal axis and an orthogonal axis, and wherein the ground strip is coupled to the ground pad in the orthogonal axis with a ground via.

6. The TL-LGA socket assembly of claim 4, wherein the signal and ground pads on the base layer have a reduced pad area.

7. The TL-LGA socket assembly of claim 4, wherein the base layer has a flooded ground plane, the flooded ground plane is coupled to at least one of a ground reference and the ground pad, wherein the flooded ground plane has a corresponding pad opening surrounding the signal pad on the base layer, and wherein the corresponding pad opening includes a gap between the signal pad and the corresponding pad opening.

8. The TL-LGA socket assembly of claim 1, wherein the ground strip has a rectangular shape, and wherein the ground strip includes at least one of a rounded corner and a perpendicular corner.

9. The TL-LGA socket assembly of claim 1, wherein the horizontal portion of the interconnect is parallel to the ground strip on the base layer to create a microstrip.

10. A package substrate, comprising:
    a base layer; and
    a signal pad and a ground strip on the base layer, wherein the ground strip is adjacent to the signal pad, wherein the ground strip is positioned vertically over a horizontal portion of an interconnect of a TL-LGA socket.

11. The package substrate of claim 10, wherein the horizontal portion is coupled to the signal pad on the base layer, wherein the base layer is above a conductive layer of a housing body of the TL-LGA socket, wherein the interconnect is in the housing body, wherein the interconnect includes a vertical portion coupled to a horizontal portion, and wherein the housing body has a top surface and a bottom surface that is opposite from the top surface, and wherein the top surface is a conductive layer.

12. The package substrate of claim 11, wherein a width of the ground strip is greater than a width of the horizontal portion.

13. The package substrate of claim 11, wherein the horizontal portion of the interconnect of the TL-LGA socket is parallel to the ground strip on the base layer to create a microstrip.

14. The package substrate of claim 10, further comprising a gap between the ground strip and the signal pad on the base layer.

15. The package substrate of claim 10, further comprising a ground pad on the base layer, wherein the ground pad is coupled to the ground strip.

16. The package substrate of claim 15, wherein the ground strip is coupled to the ground pad in at least one of a longitudinal axis and an orthogonal axis, and wherein the ground strip is coupled to the ground pad in the orthogonal axis with a ground via.

17. The package substrate of claim 15, wherein the signal and ground pads on the base layer have a reduced pad area.

18. The package substrate of claim 15, further comprising a flooded ground plane on the base layer, wherein the flooded ground plane is coupled to at least one of a ground reference and the ground pad, wherein the flooded ground plane has a corresponding pad opening surrounding the signal pad on the base layer, and wherein the corresponding pad opening includes a gap between the signal pad and the corresponding pad opening.

19. The package substrate of claim 10, wherein the ground strip has a rectangular shape, and wherein the ground strip includes at least one of a rounded corner and a perpendicular corner.

20. An assembly, comprising:
    a package substrate;
    an integrated circuit die coupled to the package substrate, wherein the package substrate includes a base layer, wherein the base layer has a signal pad and a ground strip; and
    a TL-LGA socket coupled to the package substrate, the (TL-LGA) socket including:
        an interconnect in a housing body, the interconnect includes a vertical portion and a horizontal portion, wherein the housing body has a top surface and a bottom surface that is opposite from the top surface, wherein the top surface is a conductive layer, wherein the base layer is above the conductive layer of the housing body of the TL-LGA socket, wherein the ground strip is vertically over the horizontal portion of the interconnect of the TL-LGA socket, and wherein the horizontal portion is coupled to the signal pad on the base layer.

21. The assembly of claim 20, wherein a width of the ground strip is greater than a width of the horizontal portion, and wherein the ground strip is adjacent to the signal pad, and wherein the horizontal portion of the interconnect is parallel to the ground strip on the base layer to create a microstrip.

22. The assembly of claim 20, further comprising a gap between the ground strip and the signal pad.

23. The assembly of claim 20, wherein the ground strip is coupled to a ground pad on the base layer, and wherein the ground strip has a rectangular shape, wherein the ground strip includes at least one of a rounded corner and a perpendicular corner, wherein the ground strip is coupled to the ground pad in at least one of a longitudinal axis and an orthogonal axis, and wherein the ground strip is coupled to the ground pad in the orthogonal axis with a ground via.

24. The assembly of claim 23, wherein the signal and ground pads on the base layer have a reduced pad area.

25. The assembly of claim 23, wherein the base layer has a flooded ground plane, the flooded ground plane is coupled to at least one of a ground reference and the ground pad, wherein the flooded ground plane has a corresponding pad opening surrounding the signal pad on the base layer, and wherein the corresponding pad opening includes a gap between the signal pad and the corresponding pad opening.

* * * * *